United States Patent
Najafi et al.

(10) Patent No.: US 11,811,394 B2
(45) Date of Patent: Nov. 7, 2023

(54) SUPERCONDUCTING FIELD-PROGRAMMABLE GATE ARRAY

(71) Applicant: PsiQuantum Corp., Palo Alto, CA (US)

(72) Inventors: Faraz Najafi, Palo Alto, CA (US); Qiaodan Jin Stone, Sunnyvale, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 0 days.

(21) Appl. No.: 17/838,917

(22) Filed: Jun. 13, 2022

(65) Prior Publication Data

US 2023/0148267 A1  May 11, 2023

Related U.S. Application Data

(63) Continuation of application No. 17/135,861, filed on Dec. 28, 2020, now Pat. No. 11,362,664, which is a
(Continued)

(51) Int. Cl.
*H03K 19/195* (2006.01)
*G01J 1/44* (2006.01)
(Continued)

(52) U.S. Cl.
CPC .............. *H03K 19/195* (2013.01); *G01J 1/44* (2013.01); *H10N 60/30* (2023.02); *H10N 60/84* (2023.02); *G01J 2001/442* (2013.01)

(58) Field of Classification Search
None
See application file for complete search history.

(56) References Cited

U.S. PATENT DOCUMENTS 3,059,196 A  10/1962  Lentz
3,119,076 A   1/1964  Schlig et al.
(Continued)

FOREIGN PATENT DOCUMENTS

CN  106289515 A  1/2017
CN  106549099 A  3/2017
(Continued)

OTHER PUBLICATIONS

Akhlaghi et al., "Gated Mode Superconducting Nanowire Single Photon Detectors," Express, vol. 20, No. 2, Jan. 16, 2012, 9 pgs.
(Continued)

*Primary Examiner* — Anh Q Tran
(74) *Attorney, Agent, or Firm* — Morgan, Lewis & Bockius LLP

(57) ABSTRACT

A programmable circuit includes a superconducting component arranged in a multi-dimensional array of alternating narrow and wide portions. The programmable circuit further includes a plurality of heat sources, each heat source configured to selectively provide heat to a respective narrow portion sufficient to transition the respective narrow portion from a superconducting state to a non-superconducting state. The programmable circuit further includes a plurality of electrical terminals, each electrical terminal coupled to a respective wide portion of the multi-dimensional array.

20 Claims, 17 Drawing Sheets

Superconducting Circuit 200 —▲

Related U.S. Application Data continuation of application No. 16/473,550, filed as application No. PCT/US2019/017691 on Feb. 12, 2019, now Pat. No. 10,879,905.

(60) Provisional application No. 62/660,192, filed on Apr. 19, 2018, provisional application No. 62/632,323, filed on Feb. 19, 2018, provisional application No. 62/630,657, filed on Feb. 14, 2018.

(51) Int. Cl.
*H10N 60/30* (2023.01)
*H10N 60/84* (2023.01)

(56) References Cited

U.S. PATENT DOCUMENTS

| | | | |
|---|---|---|---|
| 3,283,282 A | 11/1966 | Rosenberg | |
| 4,336,561 A | 6/1982 | Murphy | |
| 4,365,317 A | 12/1982 | Gheewala | |
| 4,509,146 A | 4/1985 | Wang et al. | |
| 4,647,954 A | 3/1987 | Graf et al. | |
| 4,989,051 A | 1/1991 | Whitehead et al. | |
| 5,026,682 A | 6/1991 | Clark et al. | |
| 5,030,614 A | 7/1991 | Hollander et al. | |
| 5,030,617 A | 7/1991 | Legge | |
| 5,041,880 A | 8/1991 | Nojima et al. | |
| 5,051,787 A | 9/1991 | Hasegawa | |
| 5,053,383 A | 10/1991 | Short et al. | |
| 5,127,928 A | 7/1992 | Farries et al. | |
| 5,173,620 A | 12/1992 | Fujimaki et al. | |
| 5,219,826 A | 6/1993 | Kapitulnik | |
| 5,247,475 A | 9/1993 | Hasunuma et al. | |
| 5,321,004 A | 6/1994 | Perez et al. | |
| 5,365,476 A | 11/1994 | Mukhanov | |
| 5,376,626 A | 12/1994 | Drehman et al. | |
| 5,455,519 A | 10/1995 | Ohori | |
| 5,481,119 A | 1/1996 | Higashino et al. | |
| 5,521,862 A | 5/1996 | Frazier | |
| 5,574,290 A | 11/1996 | You | |
| 5,719,105 A | 2/1998 | Odagawa et al. | |
| 5,825,240 A | 10/1998 | Geis et al. | |
| 5,831,278 A | 11/1998 | Berkowitz | |
| 5,892,644 A | 4/1999 | Evans et al. | |
| 5,925,892 A | 7/1999 | Mizuno et al. | |
| 6,029,075 A | 2/2000 | Das et al. | |
| 6,078,517 A | 6/2000 | Herr | |
| 6,242,939 B1 | 6/2001 | Nagasawa | |
| 6,433,974 B2 | 8/2002 | Heismann | |
| 6,774,463 B1 | 8/2004 | Chaudhari et al. | |
| 7,227,438 B2 | 6/2007 | Song et al. | |
| 7,513,765 B2 | 4/2009 | Liao | |
| 7,558,030 B2 | 7/2009 | Lee et al. | |
| 7,589,323 B2 | 9/2009 | Tanaka et al. | |
| 7,724,083 B2 | 5/2010 | Herring et al. | |
| 7,847,282 B2 | 12/2010 | Sandhu | |
| 7,852,106 B2 | 12/2010 | Herr et al. | |
| 8,330,145 B2 | 12/2012 | Wakana et al. | |
| 8,565,844 B2 | 10/2013 | Smith | |
| 8,577,430 B1 * | 11/2013 | Smith | G01J 1/44 505/160 |
| 8,736,085 B2 | 5/2014 | Sines | |
| 9,293,240 B2 | 3/2016 | Flex-Cable | |
| 9,443,576 B1 | 9/2016 | Miller | |
| 9,500,519 B2 | 11/2016 | Tang et al. | |
| 9,509,315 B2 | 11/2016 | McCaughan et al. | |
| 9,853,645 B1 | 12/2017 | Mukhanov et al. | |
| 9,876,505 B1 | 1/2018 | Dai et al. | |
| 9,954,158 B2 | 4/2018 | You et al. | |
| 9,998,122 B2 | 6/2018 | Hamilton et al. | |
| 10,103,736 B1 | 10/2018 | Powell et al. | |
| 10,133,986 B1 | 11/2018 | Newton et al. | |
| 10,171,086 B2 | 1/2019 | McCaughan et al. | |
| 10,177,298 B1 | 1/2019 | Taylor et al. | |
| 10,186,858 B2 | 1/2019 | Klaus et al. | |
| 10,197,440 B2 | 2/2019 | Najafi | |
| 10,262,776 B2 | 4/2019 | Choi et al. | |
| 10,361,703 B2 | 7/2019 | Najafi | |
| 10,386,229 B2 | 8/2019 | Najafi et al. | |
| 10,396,733 B2 | 8/2019 | Najafi et al. | |
| 10,454,014 B2 | 10/2019 | Najafi et al. | |
| 10,454,016 B2 | 10/2019 | Fong et al. | |
| 10,566,516 B2 | 2/2020 | Najafi | |
| 10,573,800 B1 | 2/2020 | Najafi | |
| 10,586,910 B2 | 3/2020 | Najafi | |
| 10,620,044 B2 * | 4/2020 | Thompson | G01J 1/0407 |
| 10,651,325 B2 | 5/2020 | Najafi et al. | |
| 10,879,905 B2 | 12/2020 | Najafi et al. | |
| 10,897,235 B2 | 1/2021 | Najafi et al. | |
| 10,911,031 B2 | 2/2021 | Wise et al. | |
| 10,944,403 B2 | 3/2021 | Najafi | |
| 11,009,387 B2 | 5/2021 | Chung et al. | |
| 2002/0149453 A1 | 10/2002 | Snitchler et al. | |
| 2003/0087503 A1 | 5/2003 | Sakaguchi et al. | |
| 2005/0153843 A1 | 7/2005 | Kubota | |
| 2005/0197254 A1 * | 9/2005 | Stasiak | G03F 7/0002 505/162 |
| 2006/0073979 A1 | 4/2006 | Thieme et al. | |
| 2006/0183327 A1 | 8/2006 | Moon | |
| 2006/0270224 A1 | 11/2006 | Song et al. | |
| 2008/0026234 A1 | 1/2008 | Sambasivan et al. | |
| 2008/0197285 A1 | 8/2008 | Frey et al. | |
| 2008/0272302 A1 | 11/2008 | Frey et al. | |
| 2009/0014433 A1 | 1/2009 | O'Neil et al. | |
| 2010/0026447 A1 | 2/2010 | Keefe et al. | |
| 2010/0171098 A1 | 7/2010 | Suzuki | |
| 2011/0108803 A1 | 5/2011 | Deligianni et al. | |
| 2011/0116742 A1 | 5/2011 | Chang et al. | |
| 2011/0254053 A1 | 10/2011 | Goupil et al. | |
| 2013/0012392 A1 | 1/2013 | Tanaka et al. | |
| 2013/0090244 A1 | 4/2013 | Shinzato et al. | |
| 2013/0124112 A1 | 5/2013 | Heath et al. | |
| 2013/0143744 A1 | 6/2013 | Marsili et al. | |
| 2013/0341594 A1 | 12/2013 | Mohseni et al. | |
| 2014/0113828 A1 | 4/2014 | Gilbert et al. | |
| 2014/0299751 A1 | 10/2014 | Tang et al. | |
| 2015/0018218 A1 | 1/2015 | Lakrimi et al. | |
| 2015/0179916 A1 | 6/2015 | Pramanik et al. | |
| 2015/0348681 A1 | 12/2015 | Huh | |
| 2016/0028402 A1 | 1/2016 | McCaughan et al. | |
| 2016/0028403 A1 | 1/2016 | McCughan et al. | |
| 2016/0356708 A1 | 12/2016 | Bennett et al. | |
| 2017/0186933 A1 | 6/2017 | Sunter et al. | |
| 2018/0033944 A1 | 2/2018 | Ladizinsky et al. | |
| 2018/0145664 A1 | 5/2018 | Herr et al. | |
| 2018/0335343 A1 | 11/2018 | Najafi et al. | |
| 2018/0364097 A1 | 12/2018 | Najafi | |
| 2018/0374979 A1 | 12/2018 | Nozawa | |
| 2019/0027672 A1 | 1/2019 | Megrant | |
| 2019/0035904 A1 | 1/2019 | Najafi | |
| 2019/0035999 A1 | 1/2019 | Najafi | |
| 2019/0044051 A1 | 2/2019 | Caudillo et al. | |
| 2019/0109595 A1 | 4/2019 | Najafi | |
| 2019/0227230 A1 | 7/2019 | Novack et al. | |
| 2019/0288132 A1 | 9/2019 | Wang et al. | |
| 2019/0378874 A1 | 12/2019 | Rosenblatt et al. | |
| 2020/0066962 A1 | 2/2020 | Najafi | |
| 2020/0080890 A1 | 3/2020 | Najafi et al. | |
| 2020/0111944 A1 | 4/2020 | Moodera et al. | |
| 2020/0176662 A1 | 6/2020 | Dayton et al. | |
| 2020/0194656 A1 | 6/2020 | Najafi | |
| 2020/0256722 A1 | 8/2020 | Najafi et al. | |
| 2021/0183767 A1 | 6/2021 | Najafi et al. | |
| 2021/0239518 A1 | 8/2021 | Chung et al. | |

FOREIGN PATENT DOCUMENTS

| | | |
|---|---|---|
| DE | 2440576 B1 | 1/1976 |
| DE | 19714191 C1 | 7/1998 |
| EP | 0299879 A2 | 1/1989 |
| EP | 1965184 A1 | 9/2008 |
| GB | 2530500 A | 3/2016 |
| JP | S63299282 A | 12/1988 |
| JP | H0555647 A | 3/1993 |

(56) References Cited

FOREIGN PATENT DOCUMENTS

| WO | WO9014715 A1 | 11/1990 |
|----|--------------|---------|
| WO | WO9409566 A1 | 4/1994 |
| WO | WO2012052628 A1 | 4/2012 |

OTHER PUBLICATIONS

Atikian, Haig A. et al., "Superconducting Nanowire Single Photon Detector on Diamond," arXiv:1401.4490v1, physics.optics, Jan. 17, 2014, 5 pgs.
Cheng, Risheng et al., "Photon-Number-Resolving Detector Based on Superconducting Serial Nanowires," IEEE Transactions on Applied Superconductivity, vol. 23, No. 1, Feb. 2013, 9 pgs.
Clem, John R. et al., "Geometry-dependent critical currents in superconducting nanocircuits," arXiv:1109.4881v1 [cond-mat.supr-con] Sep. 22, 2011, 29 pgs.
Dai, Daoxin et al., "Mode conversion in tapered submicron silicon ridge optical waveguides," Optics Express, vol. 20, No. 12, Jun. 4, 2012, 15 pgs.
Henrich, D. et al., "Geometry-induced reduction of the critical current in superconducting nanowires," arXiv:1204.0616v2 [cond-mat-supr-con] Aug. 22, 2012, 6 pgs.
Hortensius, H.L. et al., "Critical-Current Reduction in Thin Superconducting Wires Due to Current Crowding," arXiv:1203.4253v3, [cond-mat-supr-con], May 6, 2012, 5 pgs.
Korzh, B.A. et al., "Demonstrating sub-3 ps temporal resolution in a superconducting nanowire single-photon detector," Apr. 18, 2018, 26 pgs.
Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S01679317010004269).
Marsili, F., "Single-photon detectors based on ultra-narrow superconducting nanowires," Massachusetts Institute of Technology, Department of Electrical Engineering and Computer Science, Dec. 19, 2010, 31 pgs.
Mattioli, Francesco et al., "Photon-number-resolving superconducting nanowire detectors," Superconductor Science and Technology, Aug. 24, 2015, 16 pgs.
McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosopy in Electrical Engineering, 22 pgs.
Murphy et al., "Nanoscale superconducting memory based on the kinetic inductance of asymmetric nanowire loops," Departmwent of Physics, University of Illionois at Urbana-Champaign, arXiv:1701.08715v2 cond-mat.supr-con] Jun. 29, 2017, 19 pgs.
Natarajan et al., "Superconducting nanowire single-photon detectors: physics and applications", 2012, Superconduc. Sci. Technology vol. 25, p. 063001.
Quaranta et al., Superconductive Three-Terminal Amplifier/Discriminator, IEEE Transactions on Applied Superconductivity, vol. 19, No. 3, Jun. 2, 2009, 4 pgs.
Schmidt, E. et al., AIN-Buffered Superconducting NbN Nanowire Single-Photon Detector on GaAs, IEEE Transactions on Applied Superconductivity, vol. 27, No. 4, Jun. 2017, 5 pgs.
Shiino, Tatsuya et al., "Improvement of Critical Temperature of Superconducting NbTiN and NbN Thin Films Using the AIN Buffer Layer," Superconductor Science and Technology, Mar. 2010, 11 pgs.
Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.
PsiQuantum Corp., International Search Report and Written Opinion, PCT/US2018/033042, dated Aug. 28, 2018, 13 pgs.
PsiQuantum Corp., International Search Report and Written Opinion, PCT/US2018/033041, dated Jul. 27, 2018, 16 pgs.
PsiQuantum Corp., International Search Report and Written Opinion, PCT/US2018/044091, dated Nov. 7, 2018, 13 pgs.
PsiQuantum Corp., Invitation to Pay Additional Fees/Partial Search Report, PCT/US2018/037892, dated Aug. 20, 2018, 12 pgs.
PsiQuantum Corp., Invitation to Pay Additional Fees/Partial Search Report, PCT/US2018/054414, dated Jan. 24, 2019, 21 pgs.
PsiQuantum Corp., International Search Report and Written Opinion, PCT/US2018/054414, dated Mar. 20, 2019, 21pgs.
Najafi, Office Action, U.S. Appl. No. 16/028,288, dated Dec. 12, 2018, 6 pgs.
Najafi, Notice of Allowance, U.S. Appl. No. 16/028,288, dated Apr. 5, 2019, 10 pgs.
Najafi, Office Action, U.S. Appl. No. 16/028,293, dated Sep. 21, 21018, 8 pgs.
Najafi, Final Office Action, U.S. Appl. No. 16/028,293, dated Mar. 1, 2019, 5 pgs.
Najafi, Notice of Allowance, U.S. Appl. No. 16/012,520, dated Sep. 21, 2018, 9 pgs.
Najafi, Office Action, U.S. Appl. No. 16/136,124, dated Apr. 4, 2019, 9 pgs.
Najafi, Quayle Office Action, U.S. Appl. No. 16/151,180, dated Jan. 31, 2019, 5 pgs.
Najafi, Notice of Allowace, U.S. Appl. No. 16/151,180, dated Mar. 14, 2019, 5 pgs.
Najafi, Notice of Allowance U.S. Appl. No. 16/151,190, dated Feb. 6, 2019, 11 pgs.
Najafi, Notice of Allowance U.S. Appl. No. 16/151,190, dated Mar. 28, 2019, 5 pgs.
Najafi, Office Action, U.S. Appl. No. 16/046,815, dated Feb. 4, 2019, 9 pgs.
Najafi, Office Action, U.S. Appl. No. 16/046,807, dated Mar. 18, 2019, 10 pgs.
Najafi, Office Action, U.S. Appl. No. 16/107,143, dated Mar. 19, 2019, 11 pgs.
Psiquantum Corp., International Search Report and Written Opinion, PCT/US2019/017687, dated Apr. 30, 2019, 8 pgs.
Stanfield, CMOS-Compatible, Piezo-Optomechanically Tunable Photonics for Visible Wavelengths and Cryogenic, Temperatures, vol. 27, Issue 20, pp. 28588-28605, 2019.
PSIquantum Corp., International Search Report, PCT/US2019/017, dated Apr. 23, 2019, 7 pgs.
PSIquantum Corp., International Search Report and Written Opinion, PCT/US2019/030019, dated Jul. 17, 2019, 8 pgs.
PSIquantum Corp., PCT/US2018/044091, International Preliminary Report on Patentability, dated Jan. 28, 2020, 6 pgs.
Najafi, Non-Final Office Action, U.S. Appl. No. 16/664,716, dated Apr. 1, 2020, 14 pgs.
PSIquantum, International Search Report / Written Opinion, PCT/US2019/051853, dated Jan. 27, 2020, 13 pgs.
PSIquantum, International Preliminary Report on Patentability, PCT/US12018/033041, dated Nov. 26, 2019, 8 pgs.
PSIquantum, International Preliminary Report on Patentability, PCT/US2018/054414, dated Apr. 8, 2020, 15 pgs.
PSIquantum, International Search Report / Written Opinion, PCT/US2018/037892, dated Oct. 17, 2018, 18 pgs.
PSIquantum, International Preliminary Report on Patentability, PCT/US2018/037892, dated Dec. 17, 2019, 12 pgs.
Najafi, Non-Final Office Action, U.S. Appl. No. 16/553,068, dated Apr. 1, 2020, 11 pgs.
Najafi, Non-Final Office Action, U.S. Appl. No. 16/544,718, dated Aug. 17, 2020, 6 pgs.
Najafi, Non-Final Office Action, U.S. Appl. No. 16/656,506, dated Aug. 13, 2020, 18 pgs.
Najafi, Notice of Allowance, U.S. Appl. No. 16/553,068, dated Sep. 18, 2020, 10 pgs.
Najafi, Notice of Allowance, U.S. Appl. No. 16/473,550, dated Sep. 24, 2020, 8 pgs.
Najafi, Notice of Allowance, U.S. Appl. No. 16/473,550, dated Nov. 3, 2020, 2 pgs.
Najafi, Notice of Allowance, U.S. Appl. No. 16/553,068, dated Nov. 12, 2020, 2 pgs.
Najafi, Notice of Allowance, U.S. Appl. No. 16/656,506, dated Nov. 30, 2020, 12 pgs.

(56) References Cited

OTHER PUBLICATIONS

Najafi, Final Office Action, U.S. Appl. No. 16/664,716, Oct. 16, 2020, 14 pgs.
Najafi, Notice of Allowance, U.S. Appl. No. 16/473,547, dated Dec. 9, 2020, 8 pgs.
Najafi, Notice of Allowance, U.S. Appl. No. 16/543,256, dated Dec. 9, 2020, 12 pgs.
Chung, Non-Final Office Action, U.S. Appl. No. 16/849,829, dated Aug. 21, 2020, 5 pgs.
Chung, Notice of Allowance, U.S. Appl. No. 16/849,829, dated Dec. 8, 2020, 5 pgs.
PSIquantum Corp., International Search Report / Written Opinion, PCT/US20/28519, dated Jan. 21, 2021, 9 pgs.
PSIquantum Corp., Notice of Allowance, U.S. Appl. No. 16/849,829, dated Mar. 1, 2021, 8 pgs.
PSIquantum Corp., Notice of Allowance, U.S. Appl. No. 16/544,718, dated Feb. 5, 2021, 6 pgs.
PSIquantum Corp., Notice of Allowance, U.S. Appl. No. 16/664,716, dated Jan. 28, 2021, 8 pgs.
PSIquantum Corp., Notice of Allowance, U.S. Appl. No. 16/473,547, dated Jan. 27, 2021, 2 pgs.
PSIquantum Corp., Notice of Allowance, U.S. Appl. No. 16/543,256, dated Feb. 4, 2021, 2 pgs.
PSIquantum Corp., Notice of Allowance, U.S. Appl. No. 16/544,718, dated Mar. 12, 2021, 2 pgs.
PSIquantum Corp., Notice of Allowance, U.S. Appl. No. 16/544,718, dated Mar. 24, 2021, 2 pgs.
PSIquantum Corp., Notice of Allowance, U.S. Appl. No. 16/849,829, dated Apr. 5, 2021, 2 pgs.
PSIquantum, Notice of Allowance, U.S. Appl. No. 16/840,166, dated Mar. 23, 2021, 7 pgs.
PSIquantum, Notice of Allowance, U.S. Appl. No. 16/544,718, dated Apr. 26, 2021, 2 pgs.
PSIquantum, Notice of Allowance, U.S. Appl. No. 16/664,716, dated Apr. 21, 2021, 8 pgs.
PSIquantum, Notice of Allowance, U.S. Appl. No. 16/664,716, dated May 7, 2021, 2 pgs.
PSIquantum, Notice of Allowance, U.S. Appl. No. 16/543,256, dated Mar. 24, 2021, 2 pgs.
PSIquantum, Notice of Allowance, U.S. Appl. No. 16/575,274, dated Apr. 22, 2021, 10 pgs.
PSIquantum, International Preliminary Report on Patentability, PCT/US2018/033042, dated Nov. 19, 2019, 7 pgs.
PSIquantum, International Preliminary Report on Patentability, PCT/US2019/051853, dated Mar. 23, 2021, 10 pgs.
PSIquantum, International Preliminary Report on Patentability, PCT/US2019/017687, dated Aug. 18, 2020, 6 pgs.
PSIquantum, International Preliminary Report on Patentability, PCT/US2019/030019, dated Nov. 3, 2020, 7 pgs.
PSIquantum, Notice of Allowance, U.S. Appl. No. 16/840,166, dated May 24, 2021, 5 pgs.
Najafi, Notice of Allowance, U.S. Appl. No. 17/033,337, dated Mar. 16, 2022, 2 pgs.
Najafi, Notice of Allowance, U.S. Appl. No. 16/623,503, Mar. 11, 2022, 3 pgs.
Najafi, Notice of Allowance, U.S. Appl. No. 16/623,503, dated Mar. 28, 2022, 3 pgs.
Najafi, Non-Final Office Action, U.S. Appl. No. 16/813,628, dated Mar. 7, 2022, 7 pgs.
Najafi, Notice of Allowance, U.S. Appl. No. 17/033,337, dated Feb. 25, 2022, 7 pgs.
Najafi, Notice of Allowance, U.S. Appl. No. 16/623,503, dated Feb. 22, 2022, 10 pgs.
Najafi, Notice of Allowance, U.S. Appl. No. 17/195,522, dated Feb. 9, 2022, 2 pgs.
Najafi, Notice of Allowance, U.S. Appl. No. 16/773,921, dated Feb. 16, 2022, 2 pgs.
Thompson, Non-Final Office, U.S. Appl. No. 16/985,137, dated Jan. 18, 2022, 8 pgs.
Najafi, Notice of Allowance, U.S. Appl. No. 17/033,337, dated Dec. 9, 2021, 8 pgs.
McCaughan, A.N., et al., "Using Geometry to Sense Current," Nano Letters 16 (2016), 6 pgs.
Najafi, Notice of Allowance, U.S. Appl. No. 16/840,166, dated Jul. 21, 2021, 2 pgs.
Najafi, Non-Final Office Action, U.S. Appl. No. 17/135,861, dated Sep. 23, 2021, 6 pgs.
PSIquantum, International Preliminary Report on Patentability, PCT/US2019/016885, dated Aug. 11, 2020, 7 pgs.
PSIquantum, International Search Report and Written Opinion, PCT/US2019/016885, dated Apr. 24, 2019, 9 pgs.
Thompson, Non-Final Office Action, U.S. Appl. No. 16/450,911, dated Aug. 2, 2019, 6 pgs.
Thompson, Notice of Allowance, U.S. Appl. No. 16/450,911, dated Dec. 11, 2019, 5 pgs.
Thompson, Non-Final Office Action, U.S. Appl. No. 16/985,137, dated Sep. 30, 2021, 6 pgs.
Najafi, Notice of Allowance, U.S. Appl. No. 16/046,807, dated Oct. 29, 2019, 7 pgs.
Najafi, Non-Final Office Action, U.S. Appl. No. 16/046,807, dated Mar. 18, 2019, 10 pgs.
Najafi, Notice of Allowance, U.S. Appl. No. 16/136,124, dated Jun. 27, 2019, 8 pgs.
Najafi, Corrected Notice of Allowance, U.S. Appl. No. 16/136,124, dated Sep. 23, 2019, 2 pgs.
PSIquantum Corp., International Search Report and Written Opinion, PCT/US2018/060802, dated Apr. 8, 2019, 6 pgs.
PSIquantum, International Preliminary Report on Patentability, PCT/US2018/060802, dated May 18, 2020, 13 pgs.
Najafi, Notice of Allowance, U.S. Appl. No. 17/195,522, dated Nov. 12, 2021, 8 pgs.
Najafi, Notice of Allowance, U.S. Appl. No. 17/195,522, dated Nov. 16, 2021, 2 pgs.
Chung, Non-Final Office Action, U.S. Appl. No. 17/232,086, dated Dec. 16, 2021, 6 pgs.
Najafi, Notice of Allowance, U.S. Appl. No. 17/195,522, dated Dec. 9, 2021, 2 pgs.
Najafi, Notice of Allowance, U.S. Appl. No. 17/195,522, dated Jan. 7, 2022, 2 pgs.
Najafi, Notice of Allowance, U.S. Appl. No. 16/773,921, dated Dec. 24, 2021, 2 pgs.
Najafi, Notice of Allowance, U.S. Appl. No. 16/773,921, dated Nov. 15, 2021, 8 pgs.
Najafi, Notice of Allowance, U.S. Appl. No. 16/773,921, dated Sep. 22, 2021, 8 pgs.

* cited by examiner

SUPERCONDUCTING FIELD-PROGRAMMABLE GATE ARRAY

CROSS REFERENCE TO RELATED APPLICATIONS

This application is a continuation of U.S. application Ser. No. 17/135,861, filed Dec. 28, 2020, which is a continuation of U.S. application Ser. No. 16/473,550, filed Jun. 25, 2019, now U.S. Pat. No. 10,879,905, which is a U.S. National Stage Application filed under 35 U.S.C. § 371 of PCT Patent Application Serial No. PCT/US2019/017691, filed on Feb. 12, 2019, which claims the benefit of and priority to U.S. Provisional Application No. 62/660,192, filed on Apr. 19, 2018, U.S. Provisional Application No. 62/632,323, filed on Feb. 19, 2018, and U.S. Provisional Application No. 62/630,657, filed on Feb. 14, 2018, each of which is hereby incorporated by reference in its entirety.

TECHNICAL FIELD

This relates generally to superconducting components, including but not limited to, superconducting field-programmable gate arrays (FPGAs).

BACKGROUND

Logic gates are used to implement Boolean functions and perform logical operations on one or more inputs to produce an output. Thus, logic gates are essential components in many electronic devices. Field-programmable gate arrays (FPGAs) are circuits designed to be configurable by a user after manufacturing. FPGAs generally include multiple logic and memory blocks with reconfigurable interconnects that enable the blocks to be wired in different configurations to perform more complex combinational functions.

Superconductors are materials capable of operating in a superconducting state with zero electrical resistance under particular conditions.

SUMMARY

There is a need for systems and/or devices with more efficient and effective methods for implementing programmable logical operations. Such systems, devices, and methods optionally complement or replace conventional systems, devices, and methods for implementing programmable logical operations.

In one aspect, some embodiments include a superconducting component that includes: (1) a superconductor having a plurality of alternating narrow and wide portions, two or more of the wide portions each having a corresponding terminal; and (2) a plurality of heat sources, each heat source thermally coupled to a corresponding narrow portion such that heat from the heat source is transmitted to the corresponding narrow portion; where the plurality of heat sources is electrically isolated from the superconductor. In some embodiments, the superconductor is, or includes, a thin film of superconducting material. In some embodiments, the superconductor consists essentially of a thin film of superconducting material. In some embodiments, the superconducting component is configured such that in response to the transmitted heat the corresponding narrow portion transitions from a superconducting state to a non-superconducting state. In some embodiments, the plurality of heat sources is a plurality of photon detectors.

In another aspect, some embodiments include a programmable circuit having: (1) a superconducting component arranged in a multi-dimensional array of alternating narrow and wide portions; (2) a plurality of heat sources, each heat source thermally-coupled to, and electrically-isolated from, a respective narrow portion of the multi-dimensional array; and (3) a plurality of electrical terminals, each electrical terminal coupled to a respective wide portion of the multi-dimensional array.

In another aspect, some embodiments include a method of operating a programmable circuit. The method includes: (1) providing a first current to a superconducting component arranged in a multi-dimensional array of alternating narrow and wide portions, the first current configured to maintain the superconducting component in a superconducting state; (2) configuring the superconducting component to perform a first logical operation by providing constant heat to a first subset of the narrow portions, the constant heat configured to transition the first subset of narrow portions from the superconducting state to a non-superconducting state; (3) while the superconducting component is configured to perform the first logical operation: (a) receiving one or more inputs via a second subset of the narrow portions, distinct from the first subset; and (b) obtaining an electrical output via a subset of the wide portions, the electrical output corresponding to a result of the first logical operation on the one or more inputs.

Thus, superconducting devices and systems are provided with methods for programming and operating logical circuitry, thereby increasing the effectiveness, efficiency, and user satisfaction with such circuitry.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

Utilizing superconductor(s) to implement logical and readout circuit(s) allows the circuit(s) to operate at cryogenic temperatures and at nanoscale sizes, or from a different perspective, implementing such circuits utilizing superconductors or one or more superconductor elements allows such circuits to benefit from the properties of superconductors. For example, such devices would be beneficial for low-latency operations directly on a cryogenic chip.

Accordingly, some embodiments include a device including multiple superconducting thin-film nanowires, where each nanowire is thermally-coupled to a heat source input and one or more outputs. In some embodiments, the heat source inputs are optionally configured to operate in a steady state (e.g., always supplying heat or never supplying heat). The steady state inputs allows for different logical configurations of the superconducting nanowires.

Figure 1A:
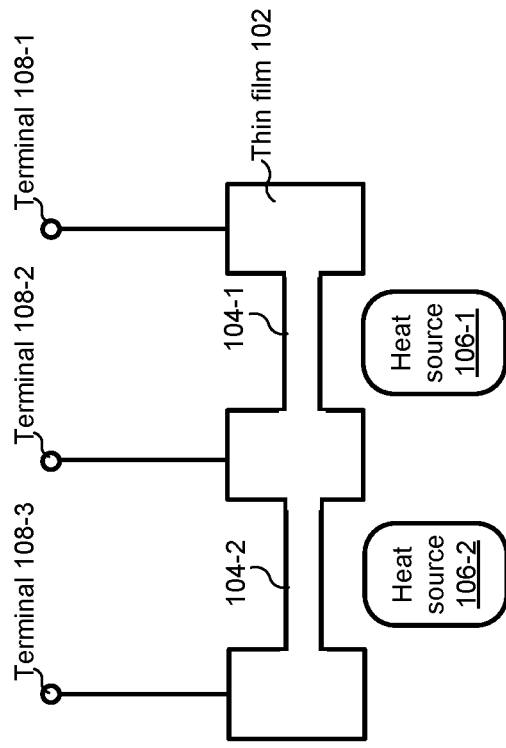
FIG. 1A is a schematic diagram illustrating a representative superconducting component in accordance with some embodiments.

FIG. 1A is a schematic diagram illustrating a superconducting component 100 including a thin film 102 having alternating narrow and wide portions, including narrow portions 104-1 and 104-2, and a terminal 108 on each wide portion (e.g., terminals 108-1, 108-2, and 108-3). In some embodiments, the thin film 102 includes a thin film of one or more superconducting materials, such as niobium or niobium alloys). The superconducting component 100 further includes heat sources 106-1 and 106-2 thermally coupled to narrow portions 104-1 and 104-2. In some embodiments, each narrow portion 104 is thermally coupled to a corresponding heat source 106. Alternatively, in embodiments that have more than two narrow portions 104, two or more of the narrow portions 104 are thermally coupled to corresponding heat sources 106.

In accordance with some embodiments, each wide portion of the superconducting component 100 has a corresponding terminal 108. Alternatively, in some embodiments, less than all of wide portions of the superconducting component have corresponding terminals 108 to which other circuitry or components can be electrically coupled. In some embodiments, each heat source 106 is electrically-isolated from the corresponding narrow portion 104. For example, each narrow portion 104 thermally coupled to a corresponding heat source is positioned such that heat is thermally transferred from the corresponding heat source 106 to the narrow portion 104, but no electrons transfer between the heat source 106 and the narrow portion 104 (e.g., no current flow or quantum tunneling). As another example, each narrow portion 104 thermally coupled to a corresponding heat source is positioned such that heat is thermally transferred from the corresponding heat source 106 to the narrow portion 104, but electron transfer between the heat source 106 and the narrow portion 104 is insufficient to generate a latch-up state in the heat source (e.g., the heat source is allowed to transition from the non-superconducting state back to the superconducting state regardless of the state of the narrow portion 104). In some embodiments, the thin film 102 and the heat sources 106 are patterned from a single thin film of superconducting material. In some embodiments, the thin film 120 is composed of niobium and/or a niobium alloy.

In some embodiments, the superconducting component is shaped, positioned, and biased such that, in response to transmitted heat from a heat source, a corresponding narrow portion transitions from a superconducting state to a non-superconducting state. In some embodiments, the wide portions connected to the narrow portion are of sufficient size to remain in a superconducting state while the narrow portion is in, or transitioning to, the non-superconducting state. In some embodiments, the wide portions are sized to thermally isolate the narrow portions from one another so that heat coupled to a respective narrow portion by a corresponding heat source is not sufficient (e.g., by itself) to cause a neighboring narrow portion to transition from a superconducting state to a non-superconducting state. In some embodiments, the width of each narrow portion is in the range of 150 nanometers (nm) to 1 micron. In some embodiments, the width of each wide portion is in the range of 1 micron to 100 microns. In some embodiments, the length of each narrow portion and each wide portion is in the range of 150 nm to 10 microns. In some embodiments, the ratio of the width of a narrow portion to the width of an adjacent wide portion is in the range of 1/2 to 1/100. In accordance with some embodiments, the wide portions are configured to function as thermal dissipaters (e.g., cooling pads) for adjacent narrow sections. In some embodiments, the wide portions prevent hot areas in some narrow portions (due to heat from the heat sources) from spreading into the other narrow portions.

In some embodiments, the superconducting component 100 is configured for use as a building block in larger circuits. In some embodiments, one or more of the superconducting components 100 are coupled to one or more additional components (e.g., to form one or more logic gates and/or readout circuits). In some embodiments, one or more of the superconducting components 100 are coupled to additional circuitry so as to operate as a superconducting field programmable gate array (FPGA).

As used herein, a "superconducting circuit" or "superconductor circuit" is a circuit having one or more superconducting materials. For example, a superconducting logic circuit is a logic circuit that includes one or more superconducting materials. As used herein, a "superconducting" material is a material that is capable of operating in a superconducting state (under particular conditions). For example, a material that operates as a superconductor (e.g., operates with zero electrical resistance) when cooled below a particular temperature (e.g., a critical temperature) and having less than a maximum current flowing through it. The superconducting materials may also operate in an "off" state where little or no current is present. In some embodiments, the superconducting materials operate in a non-superconducting state during which the materials have a non-zero electrical resistance (e.g., a resistance in the range of one thousand to ten thousand ohms). For example, a superconducting material supplied with a current greater than a threshold superconducting current for the superconducting material may transition from a superconducting state with zero electrical resistance to a non-superconducting state with non-zero electrical resistance. As an example, superconducting thin film 102 is a superconducting material that is capable of operating in a superconducting state (e.g., under particular operating conditions).

As used herein, a "wire" is a section of material configured for transferring electrical current. In some embodiments, a wire includes a section of material conditionally capable of transferring electrical current (e.g., a wire made of a superconducting material that is capable of transferring electrical current while the wire is maintained at a temperature below a threshold temperature). A cross-section of a wire (e.g., a cross-section that is perpendicular to a length of the wire) optionally has a geometric (e.g., flat or round) shape or an irregular (also sometimes called a non-geometric) shape. In some embodiments, a length of a wire is greater than a width or a thickness of the wire (e.g., the length of a wire is at least 5, 6, 7, 8, 9, or 10 times greater than the width and the thickness of the wire).

Figure 1B:
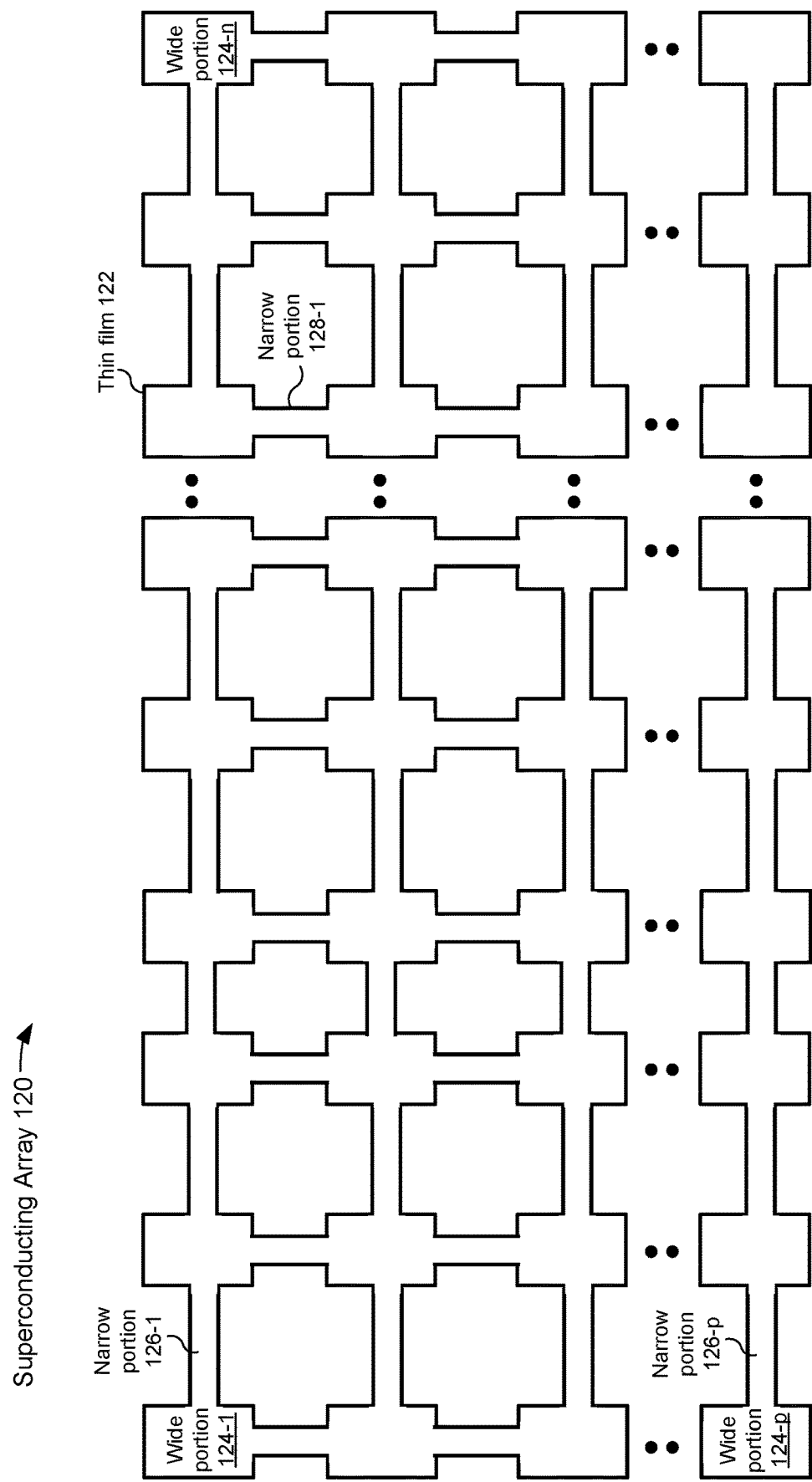
FIGS. 1B-1C are schematic diagrams illustrating representative superconducting arrays in accordance with some embodiments.
Figure 1C:
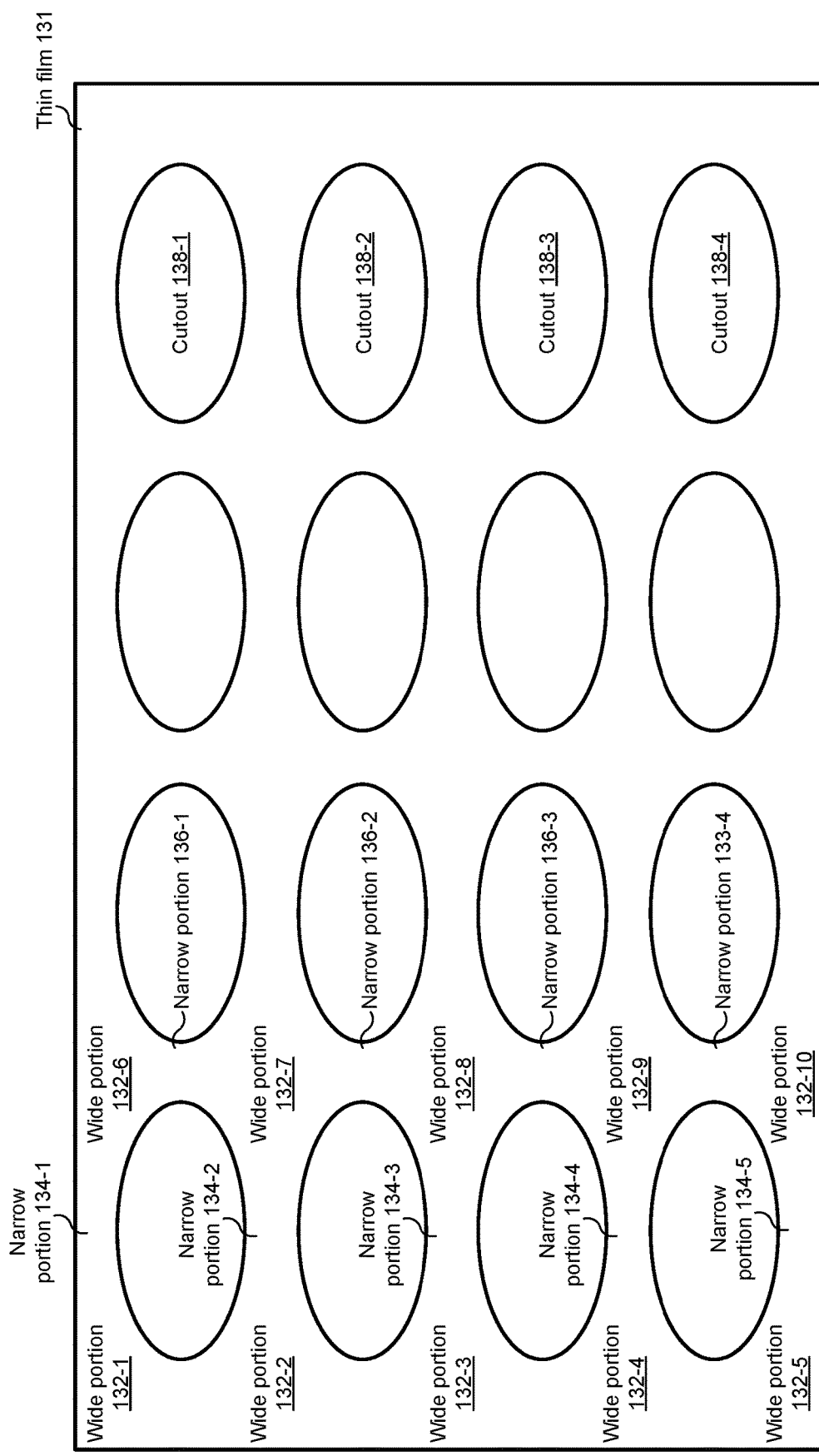

FIGS. 1B-1C are schematic diagrams illustrating representative superconducting arrays in accordance with some embodiments. FIG. 1B is a schematic diagram illustrating a superconducting array 120 in accordance with some embodiments. The superconducting array 120 includes alternating wide portions 124 and narrow portions 126, 128 (e.g., each row has "n" narrow portions and "n+1" wide portions, where, in various embodiments, "n" is equal to at least 2, at least 3, at least 4, at least 6, or at least 8). In some embodiments, the narrow portions 126, 128 each have a width that is less than a width of a wide portion 124 (e.g., half or a quarter of the width of a wide portion 124). In some embodiments, each wide portion 124 has a same length and/or width as other wide portions 124. In some embodiments, each narrow portion 126, 128 has a same length and/or width as other narrow portions 126, 128. In some embodiments, a first subset of the narrow portion 126, 128 have a different length and/or width as a second subset of the narrow portions 126, 128. For example, the narrow portions 128 have a different width than the narrow portions 126. In some embodiments, the narrow portions 126, 128 each have a width ranging from 50 nanometers (nm) to 5 microns (μm). In some embodiments, the narrow portions 126, 128 each have a length ranging from 200 nm to 2 microns μm. In some embodiments, the wide portions 124 each have a width ranging from 100 nm to 10 μm. In some embodiments, the wide portions 124 each have a length ranging from 100 nm to 10 microns μm. In accordance with some embodiments, the superconducting array 120 includes 'n' columns and 'p' rows, where 'n' and 'p' range from 1 to many (e.g., 10, 50, or 100). In some embodiments, each row of the superconducting array 120 has a same number of columns as other rows (e.g., the superconducting array 120 is rectangular in shape). In some embodiments, a first subset of the rows of the superconducting array 120 has a different number of columns as a second subset of the rows. In some embodiments, a first subset of the columns of the superconducting array 120 has a different number of rows as a second subset of the columns.

Although some of the Figures show examples of superconductors having rectangular geometry, in some embodiments, the various superconductors described herein have other geometric (e.g., oval or circular) or non-geometric forms. FIG. 1C illustrates a superconducting array 130 in accordance with some embodiments. The superconducting array 130 is composed of a superconducting thin film 131 having alternating wide portions 132 and narrow portions 134, 136 defined by curved (oval) cutouts 138 in accordance with some embodiments. In some embodiments, the various circuits described herein utilize a thin film with curved edges, such as those of the thin film 131. Curved edges and rounded corners improve current flow in some circumstances by reducing current crowding at corners. Curved edges, such as those in FIG. 1C, also reduce capacitive coupling between wide portions 132 (e.g., reduce cross-talk) in some circumstances as compared to straight edges.

Figure 2:
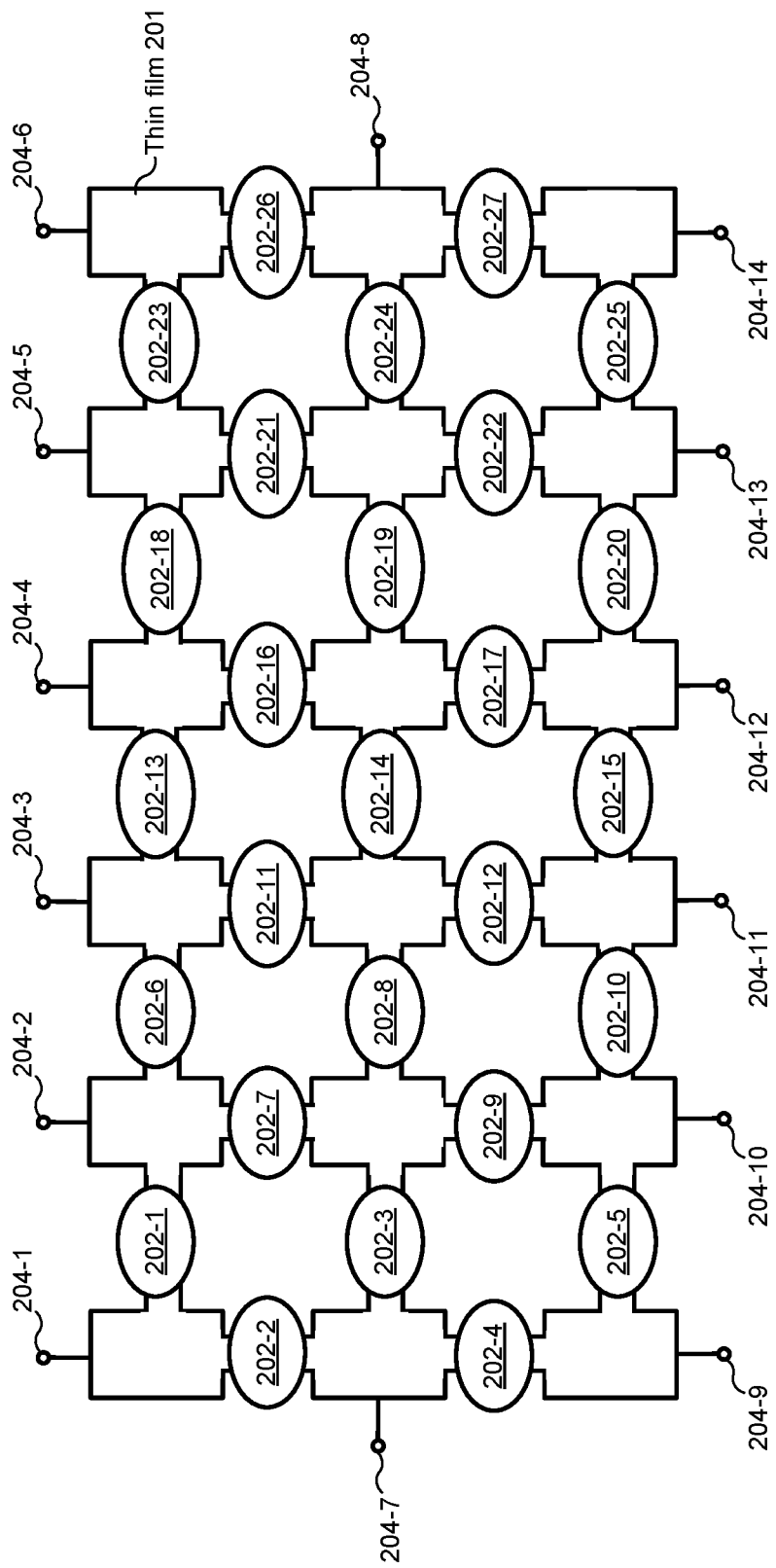
FIG. 2 is a schematic diagram illustrating a representative superconducting circuit in accordance with some embodiments.

FIG. 2 is a schematic diagram illustrating a superconducting circuit 200 in accordance with some embodiments. The superconducting circuit 200 includes a thin film 201 having alternating narrow and wide portions. The superconducting circuit 200 also includes a heat source 202 thermally coupled to each narrow portion. In some embodiments, one or more of the narrow portions is not thermally coupled to a heat source 202. For example, the superconducting circuit 200 is configured such that one or more of the narrow portions is to be maintained in a superconducting state, and accordingly a heat source 202 is not coupled to those portions. In some embodiments, a heat source 202 is thermally coupled and electrically isolated from a corresponding narrow portion, e.g., to prevent current flow and quantum tunneling. In some embodiments, the heat sources 202 include two or more types of heat sources, e.g., a first type of heat source being a photon detection circuit and a second type of heat source being a resistor. In some embodiments, a respective heat source 202 in superconducting circuit 200 is, or corresponds to, a respective heat source 106 in superconducting component 100.

The superconducting circuit 200 also includes a plurality of electrical terminals 204 on the plurality of wide portions, the terminals 204 configured to be coupled to a respective input and/or output component (e.g., a readout circuit, an electrical ground, or a current source). In some embodiments, one or more of the wide portions of thin film 201 is not connected to a respective terminal 204. In some embodiments, the terminals 204 are connected to the wide portions at positions other than those shown in FIG. 2. In some embodiments, the terminals 204 include two or more types of terminals, e.g., composed of different materials and/or having varying dimensions, resistances, and/or impedances. As discussed below with respect to FIGS. 4A-4E, the superconducting circuit 200 is programmable by adjusting operation of the heat sources 202.

Figure 3A:
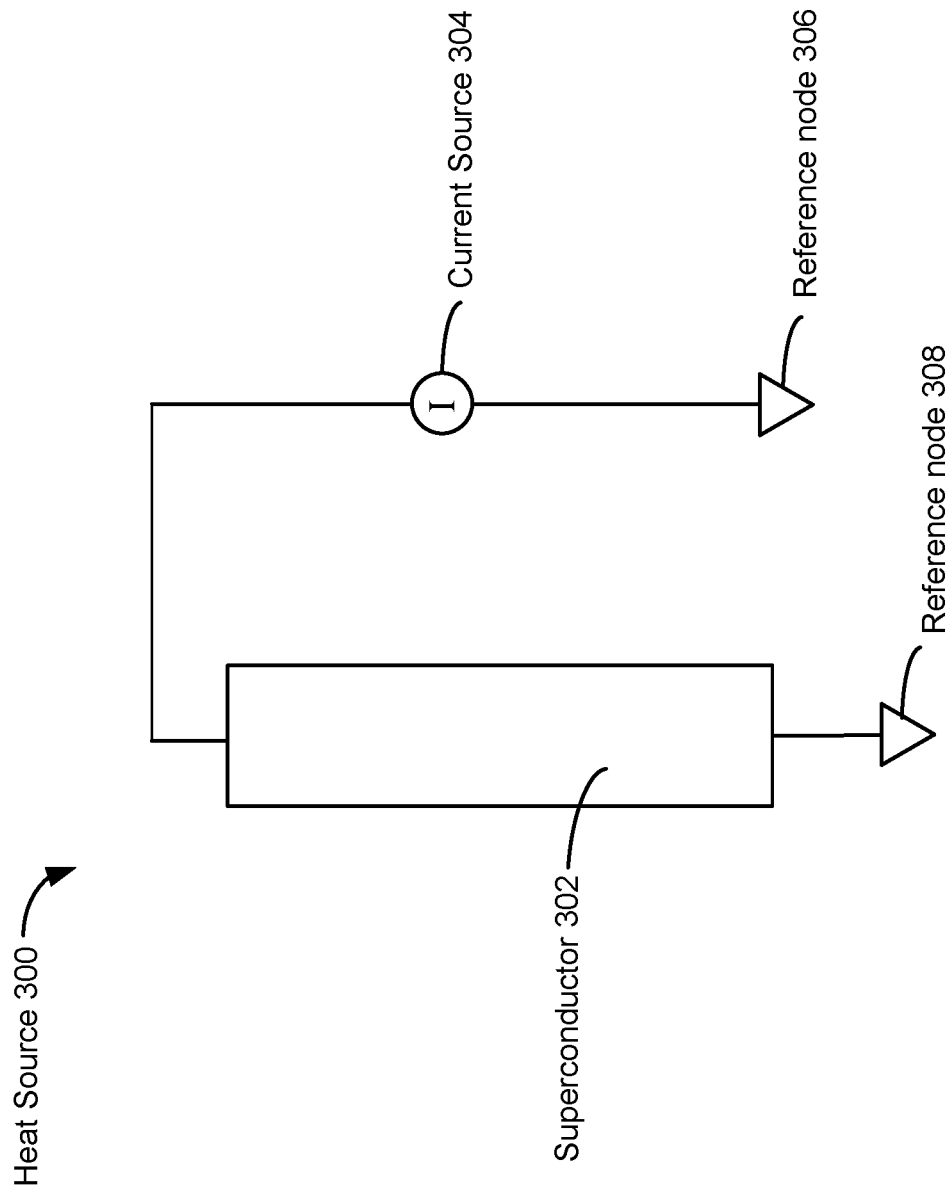
FIG. 3A is a schematic diagram illustrating a representative heat source in accordance with some embodiments.

FIG. 3A is a schematic diagram illustrating a heat source 300 in accordance with some embodiments. The heat source 300 in FIG. 3A includes a superconductor 302 coupled to a current source 304. The superconductor 302 is also coupled to a reference node 308 and the reference node 306 via the current source 304. In some embodiments, the current source 304 is configured to provide a current such that the superconductor 302 operates in a superconducting state. In some embodiments, the current source 304 is configured to provide a current such that the superconductor 302 transitions from the superconducting state to a non-superconducting state in response to one or more incident photons, for example, in response to receiving light of at least a first intensity.

In some embodiments, the superconductor 302 is positioned in proximity to a narrow superconducting portion (e.g., narrow portion 104). In some embodiments, as a result of such proximity, heat source 300 is thermally coupled to and electrically isolated from a corresponding narrow superconducting portion, such as narrow portion 104. In some embodiments, one or more of the heat sources 106, 202 is a heat source 300. In some embodiments, one or more of the heat sources 106, 202 is a gated superconducting photon detector, e.g., as described in U.S. application Ser. No. 16/028,293, filed Jul. 5, 2018, entitled "Gated Superconducting Photon Detector."

In some embodiments, one or more of the heat sources 106, 202 include another type of heat source. For example, a type of heat source utilizing a semiconductor to generate heat (e.g., via resistive heat). In some embodiments, one or more of the narrow portions 104 is coupled to a constant heat source. For example, a constant heat source configured to provide a constant source of heat sufficient to transition the narrow portion from a superconducting state to a non-superconducting state. As another example, a constant heat source is configured to provide no heat or a constant source of heat insufficient to transition the narrow portion from a superconducting state to a non-superconducting state. Additional details regarding heat sources are disclosed in U.S. application Ser. No. 16/028,293, filed Jul. 5, 2018, entitled "Gated Superconducting Photon Detector."

Figure 3B:
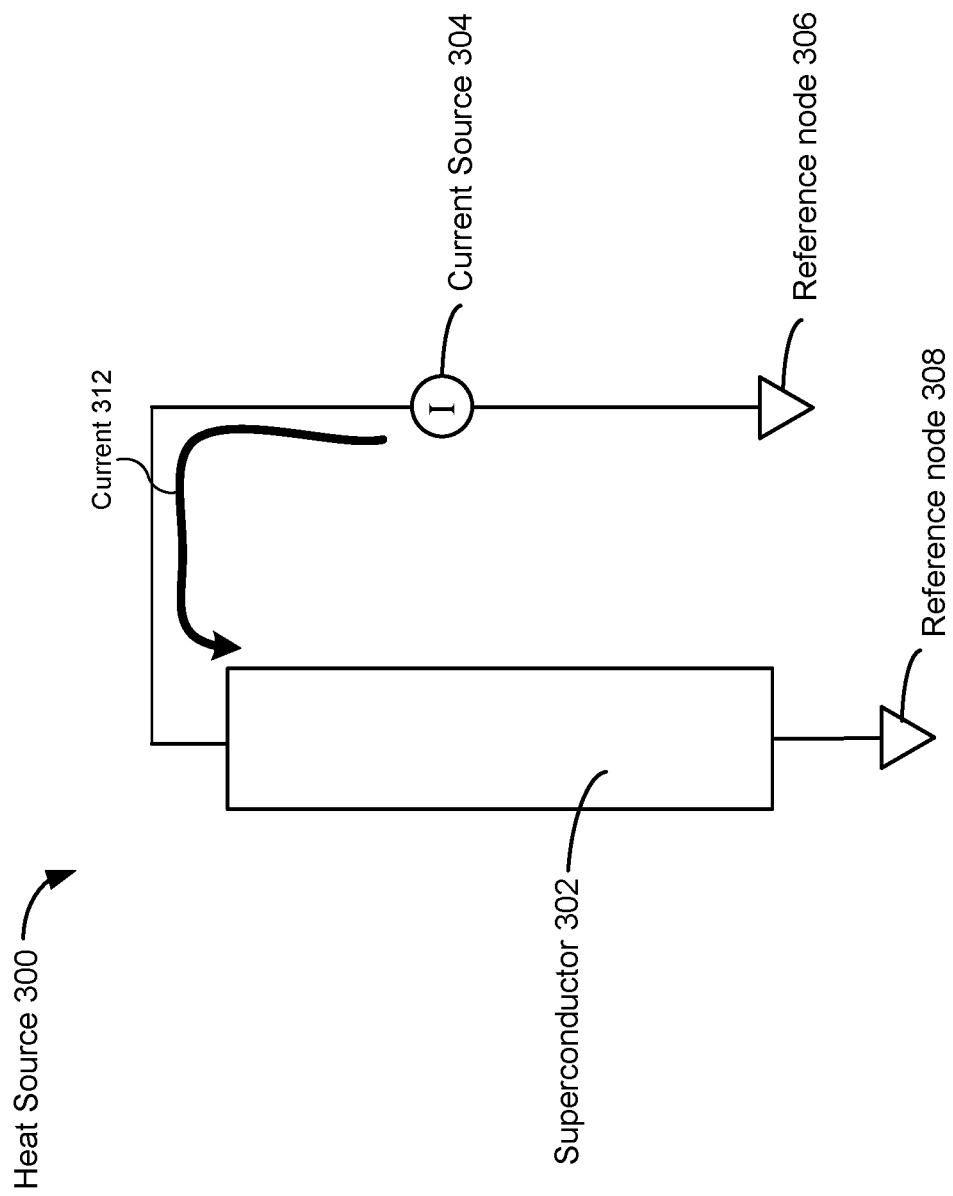
FIGS. 3B-3D are prophetic diagrams illustrating a representative operating sequence of the heat source of FIG. 3A in accordance with some embodiments.
Figure 3C:
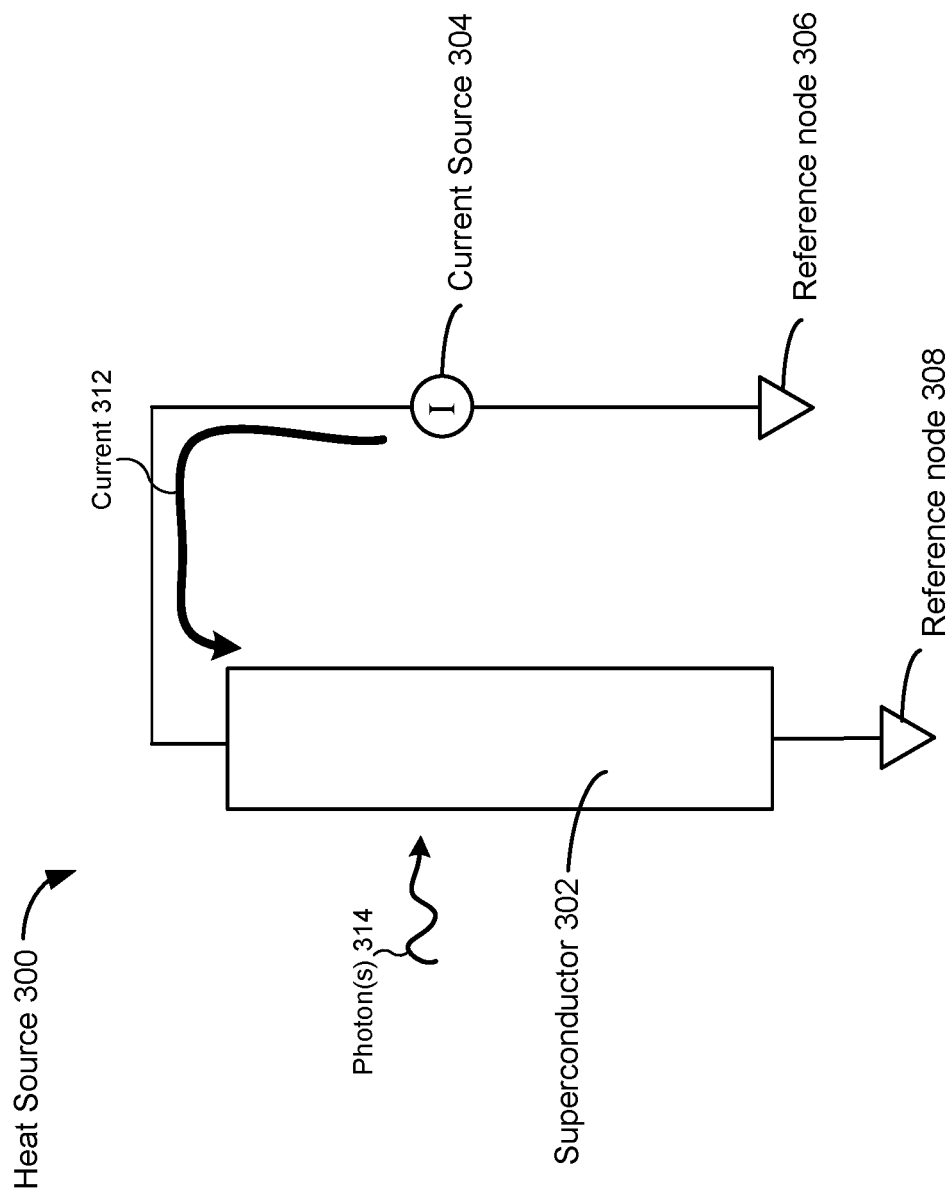
Figure 3D:
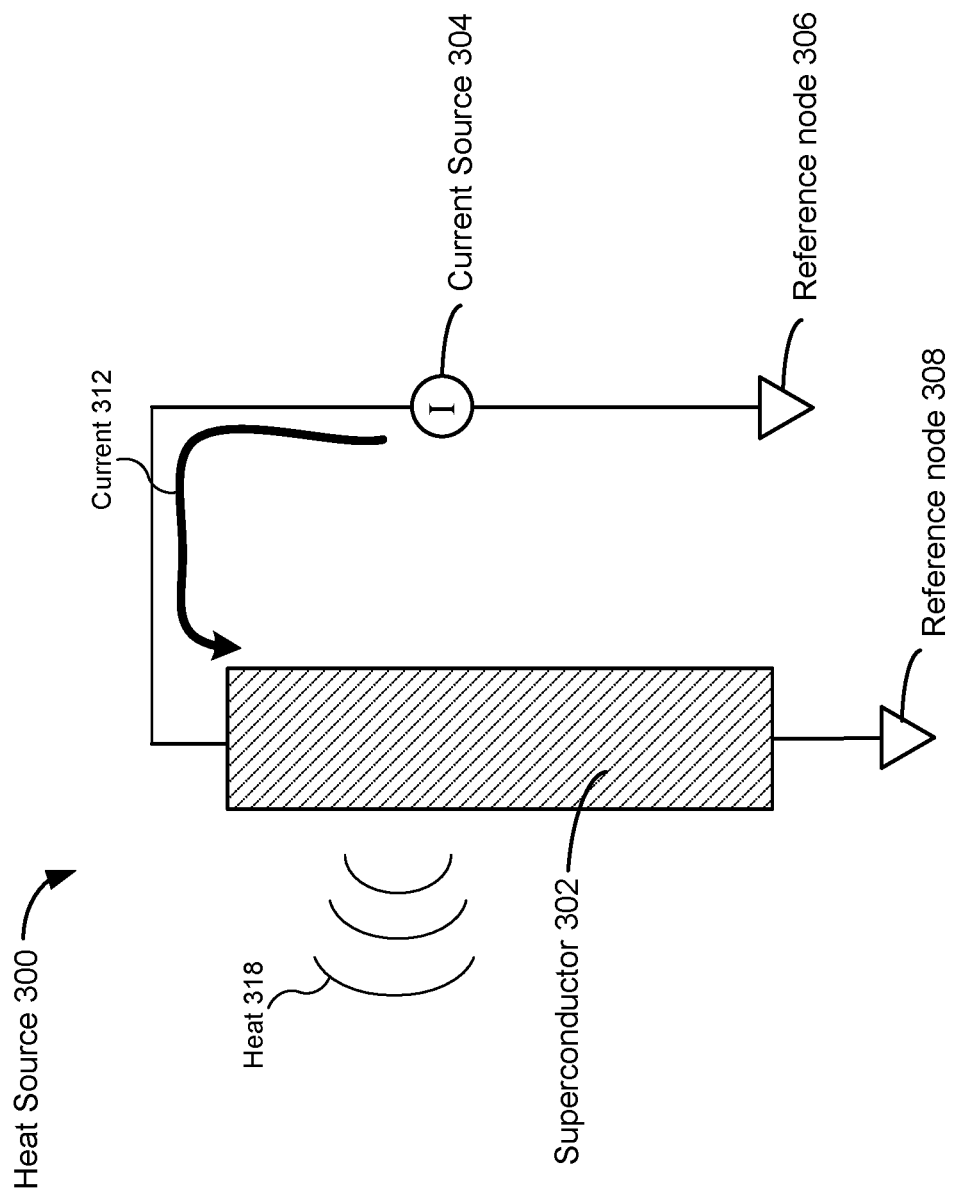

FIGS. 3B-3D are prophetic diagrams illustrating a representative operating sequence of the heat source 300 going active, from an inactive state to an active state, in accordance with some embodiments (e.g., in response to the heat source receiving light of at least a first intensity). FIG. 3B shows the current source 304 supplying a current 312 to the superconductor 302. In accordance with some embodiments, the current 312 is adapted such that the superconductor 302 operates in the superconducting state while the current 312 is supplied (e.g., the current 312 does not exceed a superconducting current threshold of the superconductor 302). As a result, the heat source 300 is in the inactive state. FIG. 3C shows one or more photons 314 impacting the superconductor 302 while the current 312 is supplied. In accordance with some embodiments, the superconductor 302 and the current 312 are configured such that receipt of the photon(s) 314 (e.g., receiving light of at least a first predefined intensity) causes superconductor 302 to transition to the non-superconducting state, as illustrated in FIG. 3D. As a result, the heat source 300 transitions to the active state, sometimes called going active. For example, the superconductor 302 and the current 312 are configured such that receipt of the photon(s) 314 lowers the superconducting current threshold of the superconductor 302 (e.g., by breaking cooper pairs) so that the current 312 exceeds the lowered threshold, thereby transitioning the superconductor 302 from the superconducting state to the non-superconducting state. FIG. 3D shows the superconductor 302 in the non-superconducting state (e.g., as illustrated by the striped patterning) in response to the current 312 and the photon(s) 314. FIG. 3D also shows the superconductor 302 generating heat 318 (e.g. resistive heat) as the current 312 flows through the superconductor 302 in the non-superconducting state. In some embodiments, the heat 318 is the heat generated by a heat source 106. In some embodiments, the heat source 300 is positioned such that the heat 318 is transferred to a narrow portion 104 (e.g., see FIG. 1A). In some embodiments, the heat source 300 is configured such that the heat 318 is sufficient to transition a narrow portion 104 of the thin film 102 from the superconducting state to the non-superconducting state.

By electrically isolating the photon detector circuits as heat source inputs to a superconducting readout circuit (e.g., the circuits shown in FIGS. 5A-5C), the photon detector circuits are more accurate and stable. For example, there is no current flow from the readout circuit into the photon detector circuits to produce false positives or otherwise disrupt the functionality of the photon detector circuits. As another example, the photon detector circuits are electrically-isolated from one another to prevent them from influencing one another (e.g., and producing false positives). Moreover, the photon detector circuits are allowed to be reset quickly (e.g., no latching) after a photon trigger while the readout circuitry may be configured to hold the detection longer, e.g., the corresponding narrow portion of the thin film is optionally maintained in the non-superconducting state for an extended time. For example, the narrow portion of the thin film is maintained in the non-superconducting state until the circuit is reset (e.g., by ceasing to supply a current to the thin film). This allows the counting of photons that are staggered in time (e.g., photons that occur or are received at different times) using discrete photon detector circuits.

Figure 4A:
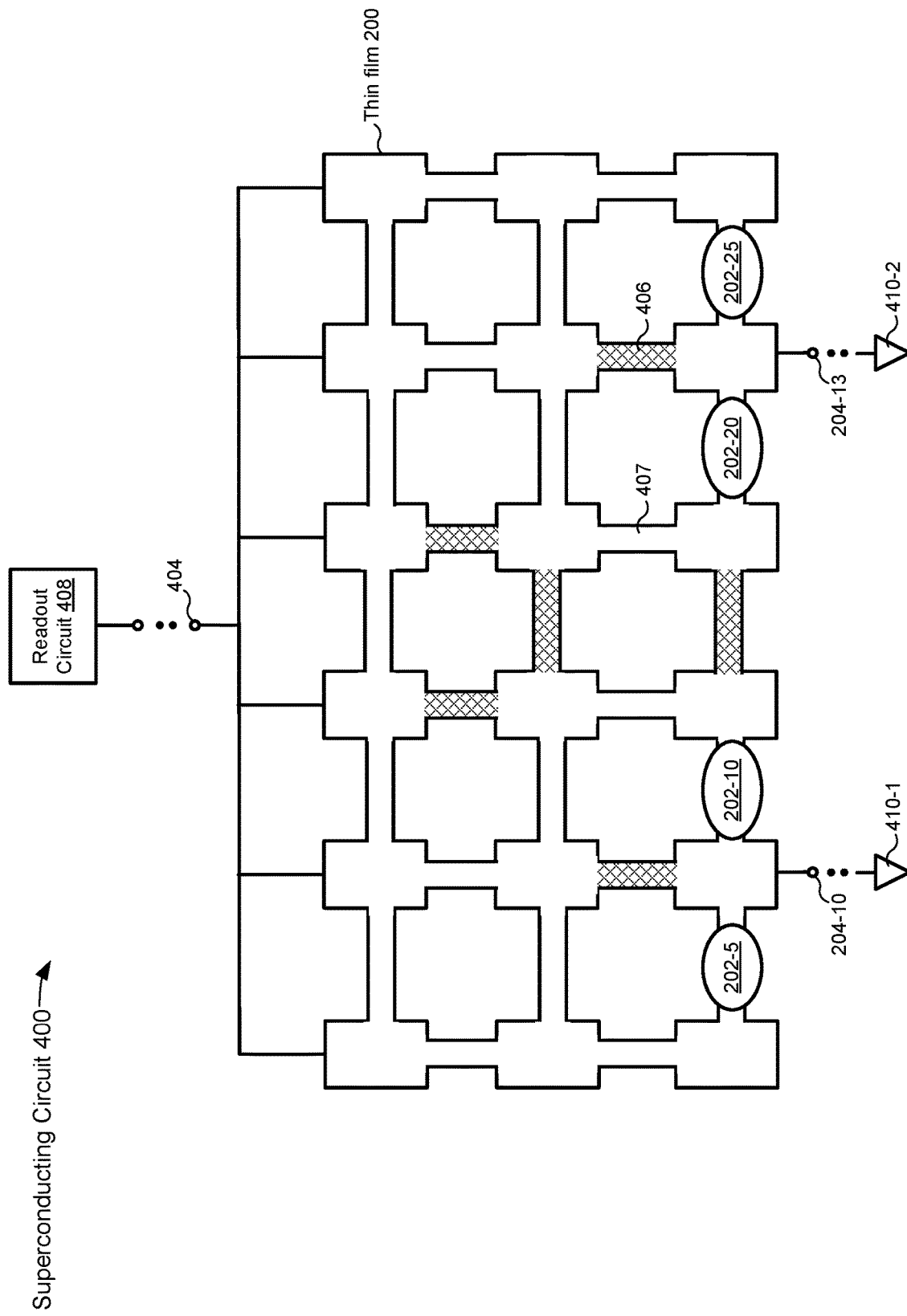
FIGS. 4A-4B are schematic diagrams illustrating a representative superconducting circuit in an example programmed state in accordance with some embodiments.
Figure 4B:
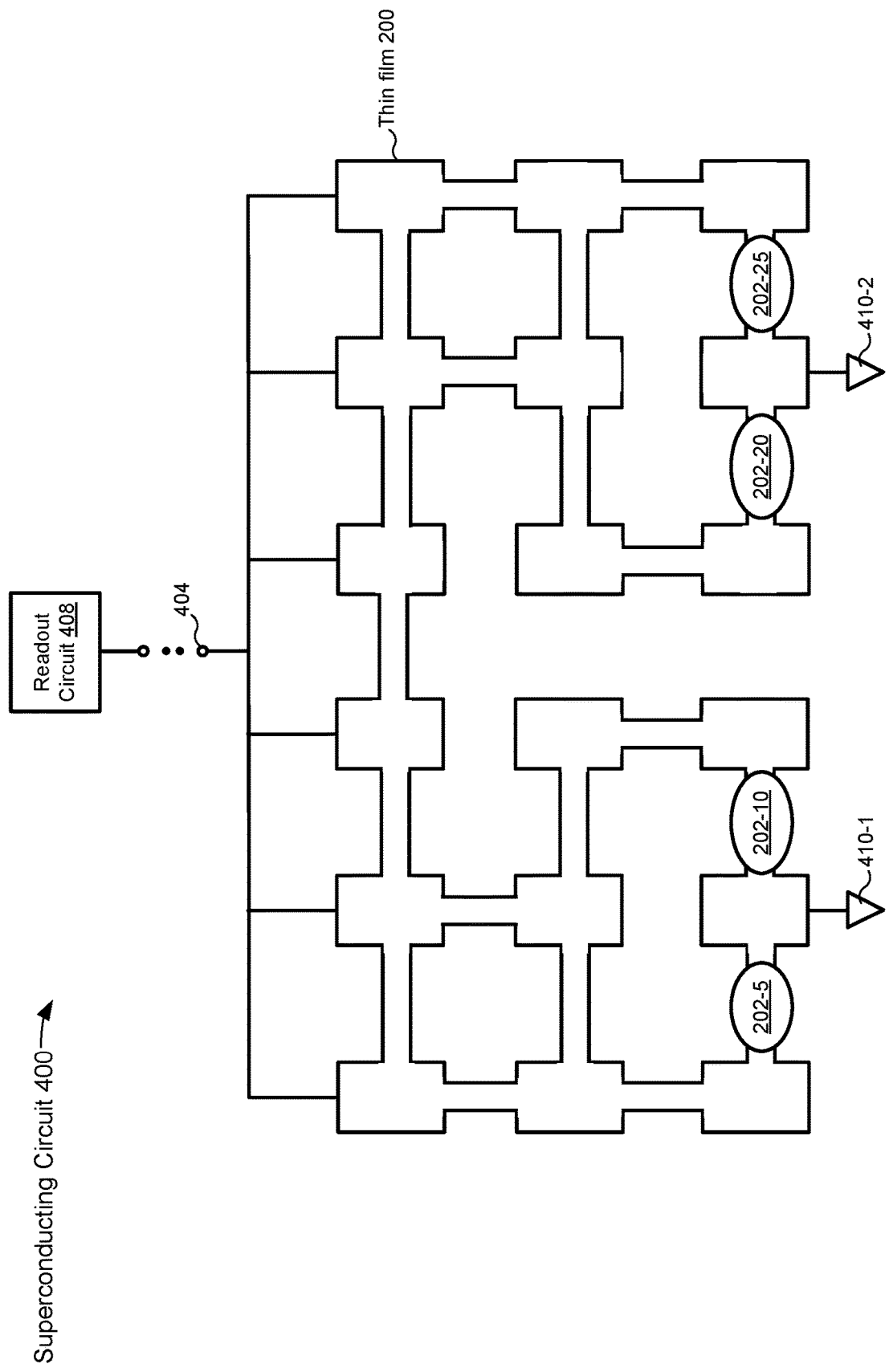

FIGS. 4A-4B are schematic diagrams illustrating a superconducting circuit 400 in an example programmed state in accordance with some embodiments. The superconducting circuit 400 includes the superconducting circuit 200 illustrated in FIG. 2 with heat sources 202-5, 202-10, 202-20, and 202-25 configured as inputs and a readout circuit 408 coupled via terminal 404 and configured as an output. In the example of FIG. 4A, the other heat sources 202 from FIG. 2 have been configured to be in a steady state (e.g., constantly providing heat or not providing heat). The heat sources 202 configured to constantly provide heat cause the corresponding narrow portions to transition from the superconducting state to a non-superconducting state, as illustrated by crosshatching on narrow portion 406. The narrow portions corresponding to the heat sources 202 configured not to provide heat are maintained in the superconducting state, as illustrated by the lack of crosshatching on narrow portion 407. The superconducting circuit 400 further includes reference nodes 410 (e.g., electrical grounds) coupled to the terminals 204-10 and 204-13. For clarity, the heat sources 202 configured to be in a steady state and the terminals 204 uncoupled in the example programmed state are not shown in FIGS. 4A-4E.

FIG. 4B illustrates another view of the superconducting circuit 400 where the narrow portions of the thin film 201 in the non-superconducting state (e.g., the narrow portion 406) are not represented. Due to the zero resistance of the portions of the thin film 201 in the superconducting state, there is negligible current flow through the portions in the non-superconducting state.

Figure 4C:
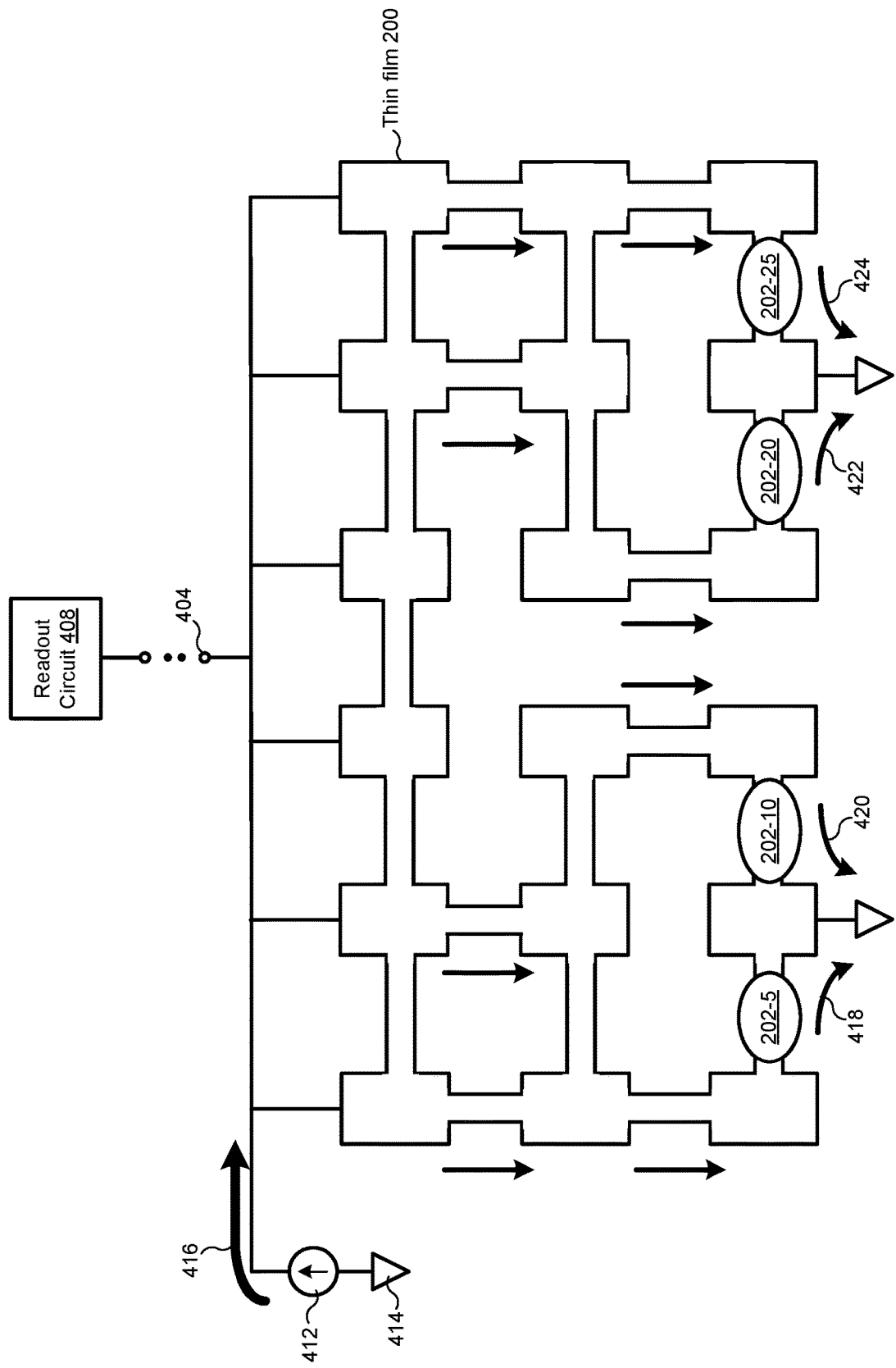
FIGS. 4C-4E are prophetic diagrams illustrating a representative operating sequence of the superconducting circuit of FIG. 4B in accordance with some embodiments.
Figure 4D:
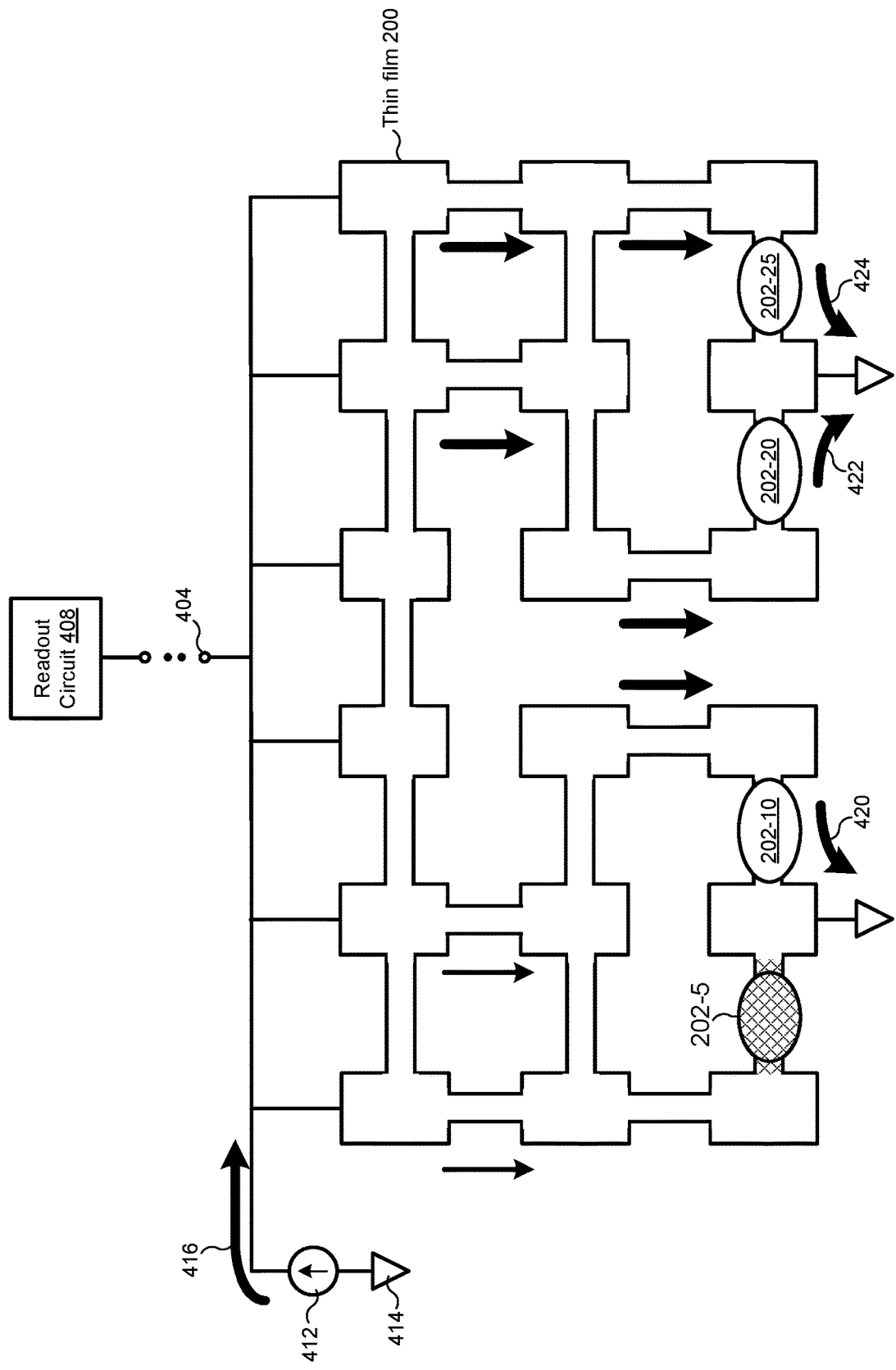
Figure 4E:
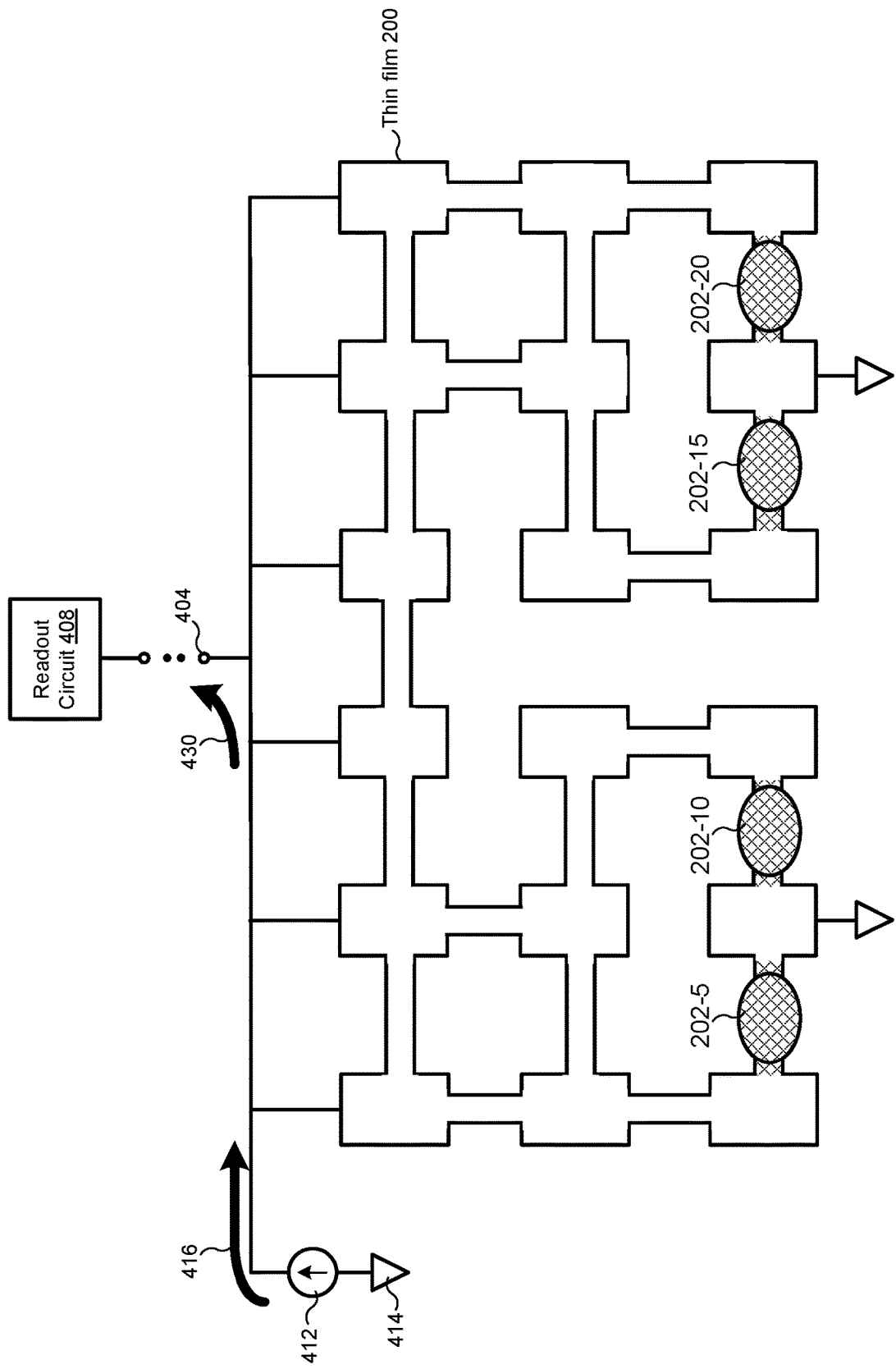

FIGS. 4C-4E are prophetic diagrams illustrating a representative operating sequence of the superconducting circuit 400 of FIG. 4B in accordance with some embodiments. FIG. 4C shows a current source 412 and reference node 414 coupled to the thin film 201. FIG. 4C further shows the current source 412 supplying a current 416 to the thin film 201. In accordance with some embodiments, the readout circuit 408 has a non-zero resistance and thus all, or nearly all (e.g., 90%, 95%, or 99%), of the current flows through the thin film 201. At the first time illustrated in FIG. 4C the heat sources 202-5, 202-10, 202-20, and 202-25 are not producing heat (e.g., are not active) and thus portions of the current 416 flows through each corresponding narrow portion to the reference nodes 410, as illustrated by the arrows 418, 420, 422, and 424.

FIG. 4D illustrates the superconducting circuit 400 at a second time where the heat source 202-5 is active (e.g., is producing heat sufficient to transition the corresponding narrow portion of the thin film 201 from the superconducting state to the non-superconducting state) as indicated by the crosshatching of heat source 202-5 and the corresponding narrow portion. As a result of the narrow portion transitioning to the non-superconducting state, the current 418 flowing through the narrow portion at the first time (FIG. 4C) is redistributed through the other narrow portions, as illustrated by the widening of the arrows 420, 422, and 424.

FIG. 4E illustrates the superconducting circuit 400 at a third time where the heat sources 202-5, 202-10, 202-15, and 202-20 are active as indicated by the crosshatching of the heat sources and the corresponding narrow portions. As a result of the narrow portions transitioning to the non-superconducting state, at least a portion of the current 416 is redistributed to the readout circuit 408, as illustrated by the arrow 430. In some embodiments, the readout circuit 408 is configured to interpret the current flow 430 as a logical "1" output and any current flow in FIGS. 4C and 4D as a logical "0" output.

Figure 5A:
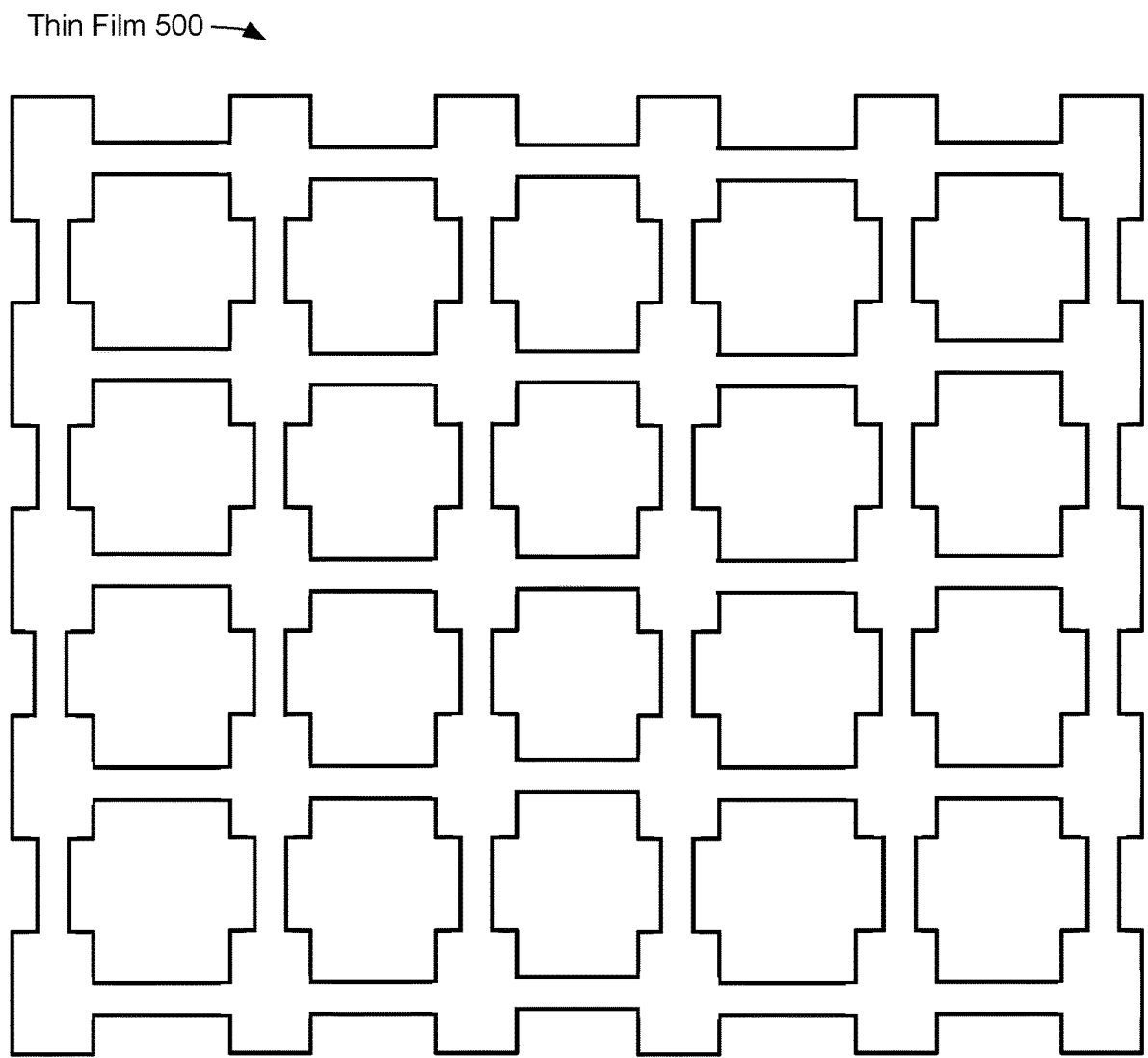
FIG. 5A is a schematic diagram illustrating a representative superconducting thin film, or superconducting component implemented using superconducting thin film, in accordance with some embodiments.
Figure 5B:
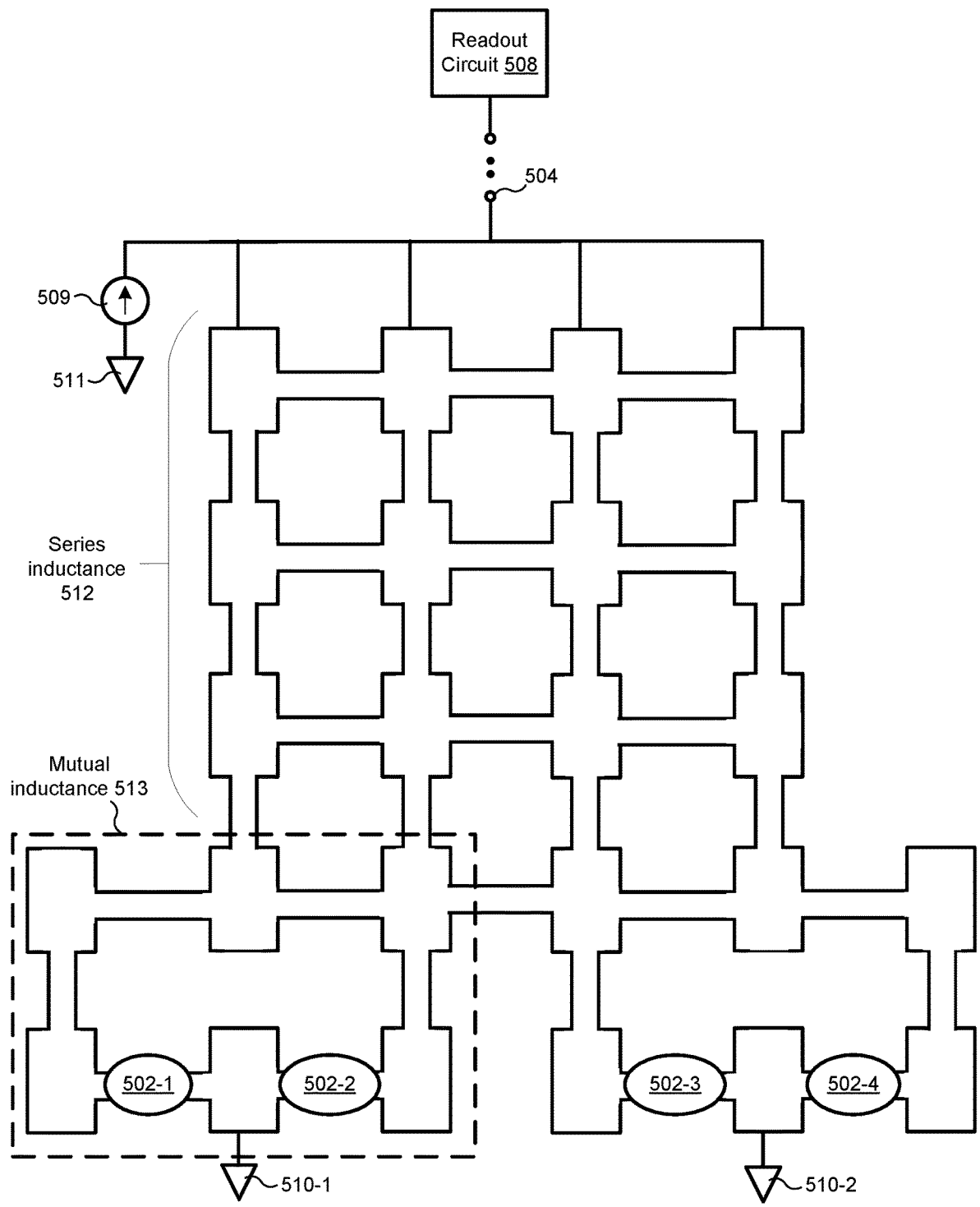
FIGS. 5B-5D are schematic diagrams illustrating example programmed states of the representative thin film of FIG. 5A in accordance with some embodiments.
Figure 5C:
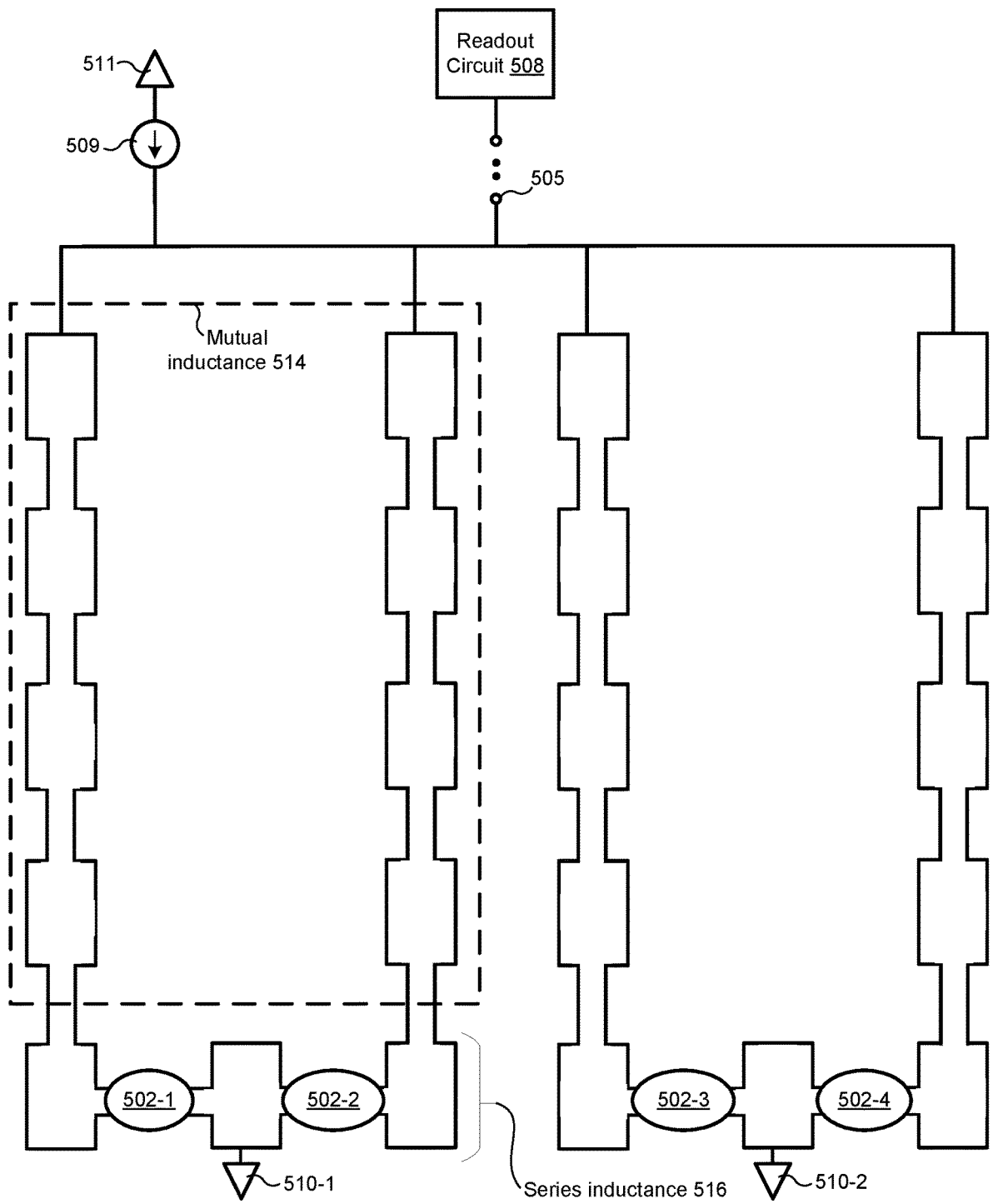
Figure 5D:
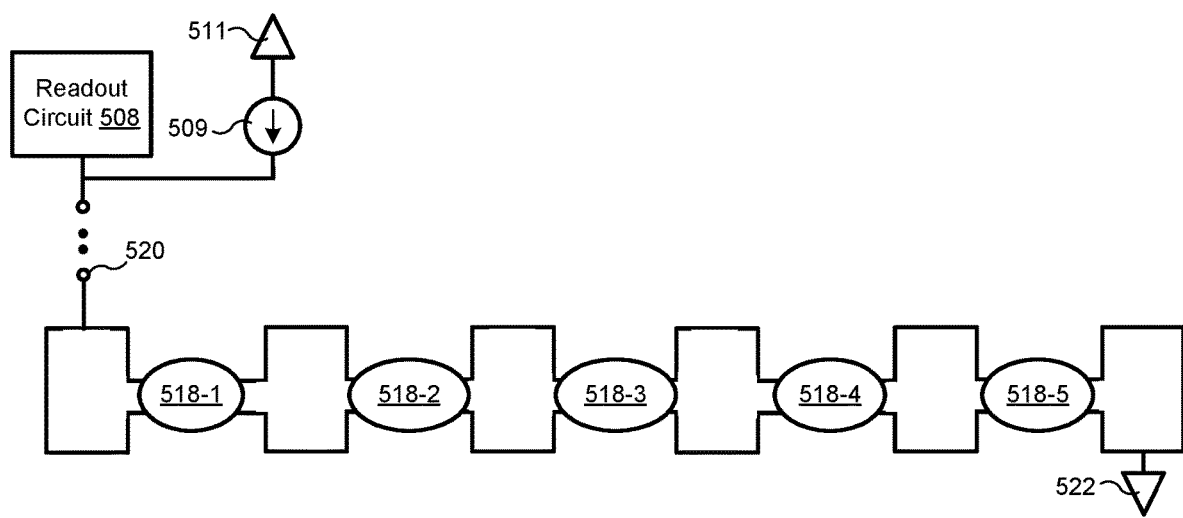

FIG. 5A is a schematic diagram illustrating a superconducting thin film 500 and FIGS. 5B-5D are schematic diagrams illustrating example programmed states of the representative thin film 500 in accordance with some embodiments. In FIGS. 5B-5D the portions of the thin film 500 that are in the non-superconducting state, or are separated from the inputs 502 by the portions in the non-superconducting state, are not shown.

FIG. 5B shows a superconducting circuit 501 including the thin film 500 in a first programmed state in accordance with some embodiments. In accordance with some embodiments, in the first programmed state the superconducting circuit 501 operates as a logical AND/OR/MAJORITY gate. In the first programmed state, the thin film 500 has a series inductance 512 that is greater than a mutual inductance 513. In some embodiments and circumstances, the series inductance 512 and mutual inductance 513 enhance a cascade effect of current for the logical functions by reducing (e.g., minimizing) impedance for current redistributing from flowing through one narrow portion to flowing through another narrow portion.

FIG. 5C shows a superconducting circuit 501 including the thin film 500 in a second programmed state in accordance with some embodiments. In accordance with some embodiments, in the second programmed state the superconducting circuit 501 operates as an additive current gate. In the second programmed state, the thin film 500 has a series inductance (e.g., series inductance 516) that is less than a mutual inductance 514. In some embodiments and circumstances, the large mutual inductance 514 enhance reduces (e.g., minimizes) impedance for current redistributing from flowing through one narrow portion to flowing to the readout circuit 508.

FIG. 5D shows a superconducting circuit 501 including the thin film 500 in a third programmed state in accordance with some embodiments. In accordance with some embodiments, in the third programmed state the superconducting circuit 501 operates as an additive resistance gate. In the third programmed state, the thin film 500 has a resistance that corresponds to (e.g., is proportional to) a number of the heat sources 518 that are active at a given time.

Thus, FIGS. 5B-5D illustrate various programmable states of the superconducting circuit 501. The superconducting circuit 501 is configurable after manufacture by adjusting operation of the heat sources as described previously. In this way, the superconducting circuit 501 provides functionality of an FPGA.

In light of these principles, we now turn to certain embodiments.

In accordance with some embodiments, a programmable circuit includes: (1) a superconducting component (e.g., the thin film 201) arranged in a multi-dimensional array of alternating narrow and wide portions; (2) a plurality of heat sources (e.g., heat sources 202), each heat source thermally-coupled to, and electrically-isolated from, a respective narrow portion of the multi-dimensional array; and (3) a plurality of electrical terminals (e.g., terminals 204), each electrical terminal coupled to a respective wide portion of the multi-dimensional array.

In some embodiments, the plurality of heat sources includes heat sources described above, e.g., the heat sources 106, 202, 300. In some embodiments, each heat source is, or includes, a superconductor. For example, FIG. 3A illustrates a heat source 300 including a superconductor 302 configured to generate heat in response to incident photon(s). In some embodiments, one or more of the heat sources is, or includes, a semiconductor (e.g., a semiconductor configured to generate heat in response to receiving current from a current source). In some embodiments, one or more of the heat sources is a constant heat source configured to maintain the corresponding narrow portion in a non-superconducting state. In some embodiments, a first heat source of the plurality of heat sources, or each heat source in a subset of heat sources (e.g., two or more of the heat sources), is, or includes, a photon detector. For example, the first heat source is the heat source 300 described above with respect to FIGS. 3A-3D. As another example, the first heat source is, or includes, a gated superconducting photon detector.

In some embodiments, the plurality of heat sources is configured to selectively provide heat to the respective narrow portions sufficient to transition the respective narrow portions from a superconducting state to a non-superconducting state. For example, the heat source 202-5 selectively provides heat in FIGS. 4C-4D sufficient to transition the corresponding narrow portion of the thin film 201 from a superconducting state in FIG. 4C to a non-superconducting state in FIG. 4D.

In some embodiments, a first subset of the plurality of heat sources are configured to provide a constant heat to the respective narrow portions sufficient to maintain the respective narrow portions in a non-superconducting state. For example, heat source 202-22, the heat source corresponding to narrow portion 406 in FIG. 4A, is configured to provide constant heat to the narrow portion 406 in the example illustrated in FIG. 4A.

In some embodiments, a second subset of the plurality of heat sources are configured as logical inputs to the superconducting component. For example, the heat sources 202-5, 202-10, 202-20, and 202-25 are configured as logical inputs in FIGS. 4A-4E.

In some embodiments, the superconducting component is configured to: (1) operate in a first logical mode while a first subset of the plurality of heat sources is providing constant heat; and (2) operate in a second logical mode while a second subset of the plurality of heat sources is providing constant heat. For example, the superconducting component is configured to operate as a majority gate in the first mode (illustrated in FIG. 5B) and as an additive resistance gate in the second mode (illustrated in FIG. 5D).

In some embodiments, the superconducting component is arranged in a two-dimensional array (e.g., thin film 500, FIG. 5A). In some embodiments, the superconducting component is arranged in a three-dimensional array. In some embodiments, the superconducting component is patterned from a single thin film of superconducting material (e.g., a niobium-germanium thin film).

In some embodiments, each narrow portion of the multi-dimensional array has substantially the same shape (e.g., within a 5%, 10%, or 20% deviation). In some embodiments, at least one narrow portion has a distinct shape from other narrow portions and a correspondingly distinct heat source. For example, in FIG. 1C the narrow portion 134-1 has a different shape than the narrow portion 134-2. In some embodiments, the narrow portions in a first subset of the narrow portions have a first shape and a first impedance when not in the superconducting state, and the narrow portions in a second subset of the narrow portions have a second shape, different from the first shape, and a second impedance, different from the first impedance when not in the superconducting state. In some embodiments, narrow portions said to have a respective impedance (e.g., the first impedance or second impedance) have impedances within a predefined margin, such as 5%, 10% or 20%, of the respective impedance. In some embodiments, variations in impedance within the predefined margin are consistent with performance of one or more predefined operations by the superconducting component or programmable circuit, such as any of the operations discussed elsewhere in this document.

In some embodiments, the programmable circuit includes a current source (e.g., the current source 412, FIG. 4C) coupled to the superconducting component, the current source configured to, in the absence of heat from the plurality of heat sources, maintain the superconducting component in a superconducting state. In some embodiments, the current source is configured to selectively vary the current, e.g., to adjust operation of the programmable circuit. For example, the current source is configured to: (a) provide a first current to operate the programmable circuit in a logical OR mode, and (b) provide a second current to operate the programmable circuit in a logical AND mode.

In some embodiments, the programmable circuit includes an output circuit (e.g., the readout circuit 408) coupled to at least a subset of the plurality of electrical terminals. For example, in FIG. 5B the readout circuit 508 is coupled to the thin film 500 via electrical terminal 504. In some embodiments, the output circuit is configured to measure an amount of current flowing to the output circuit from a current source, or to produce an output signal in accordance with the amount of current flowing to the output circuit from a current source. In some embodiments, the output circuit is, or includes, one or more semiconductor components and/or one or more superconducting components.

In some embodiments, one or more of the plurality of electrical terminals are coupled to a reference node (e.g., an electrical ground node or other reference voltage node). For example, FIG. 4A shows reference nodes 410-1 and 410-2 coupled to electrical terminals 204-10 and 204-13 respectively.

In accordance with some embodiments, a method of operating a programmable circuit includes: (1) providing a first current (e.g., via the current source 412, FIG. 4C) to a superconducting component arranged in a multi-dimensional array of alternating narrow and wide portions (e.g., the thin film 201), the first current configured to maintain the superconducting component in a superconducting state; (2) configuring the superconducting component to perform a first logical operation by providing constant heat to a first subset of the narrow portions (e.g., the narrow portion 406, FIG. 4A), the constant heat configured to transition the first subset of narrow portions from the superconducting state to a non-superconducting state; (3) while the superconducting component is configured to perform the first logical operation: (a) receiving one or more inputs via a second subset of the narrow portions, distinct from the first subset (e.g., the heat produced by the heat source 202-5 in FIG. 4D); and (b) obtaining an electrical output via a subset of the wide portions, the electrical output corresponding to a result of the first logical operation on the one or more inputs (e.g., receiving the current 430 at the readout circuit 408 in FIG. 4E).

In some embodiments, the method further includes: (1) configuring the superconducting component to perform a second logical operation, distinct from the first logical operation, by providing constant heat to a third subset of the narrow portions, the constant heat configured to transition the third subset of narrow portions from the superconducting state to the non-superconducting state; and (2) while the superconducting component is configured to perform the second logical operation: (a) receiving one or more second inputs via a fourth subset of the narrow portions, distinct from the third subset; and (b) obtaining a second electrical output via a second subset of the wide portions, the second electrical output corresponding to a result of the second logical operation on the one or more second inputs. In some embodiments, the second inputs for the second logical operation are received at the same nodes of the superconducting component or programmable circuit as the inputs for the first logical operation, and in those embodiments the fourth subset of the narrow portions is the same as the second subset of the narrow portions. In some embodiments, at least one of the second and fourth subsets of the narrow portions includes at least some of the narrow portions in the other subset as well as additional narrow portions not in the other subset.

In some embodiments, the first logical operation is a logical AND operation, a logical OR operation, a majority gate operation, or an input counting operation.

In some embodiments, the one or more inputs are heat inputs configured to transition the second subset of narrow portions from the superconducting state to the non-superconducting state.

In some embodiments, configuring the superconducting component to perform the first logical operation includes coupling one or more of the wide portions to a reference node (e.g., an electrical ground, sometimes called a circuit ground, or other reference voltage).

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method comprising:
   providing current to a superconducting multidimensional array in a first configuration, the superconducting multidimensional array comprising alternating narrow portions and wide portions, the current provided, in the first configuration, to a first superconducting set of the narrow portions such that the first superconducting set of narrow portions remain in a superconducting state while a first non-superconducting set of the narrow portions remain in a non-superconducting state, one or more of the wide portions being connected to electrical terminals that are connected to a programmable circuit;
   outputting, from the superconducting multidimensional array in the first configuration, a first electrical output to the programmable circuit, the first electrical output being provided through the electrical terminals that are connected to the one or more of the wide portions;
   providing additional current to the superconducting multidimensional array in a second configuration, the additional current provided, in the second configuration, to a second superconducting set of the narrow portions such that the second superconducting set of the narrow portions remain in the superconducting state while a second non-superconducting set of the narrow portions remain in the non-superconducting state; and
   outputting, from the superconducting multidimensional array in the second configuration, a second electrical output to the programmable circuit, the second electrical output being provided through the electrical terminals that are connected to the one or more the wide portions.

2. The method of claim 1, wherein a narrow portion of the superconducting multidimensional array is included in the first superconducting set of the narrow portions in the first configuration.

3. The method of claim 2, wherein the narrow portion of the superconducting multidimensional array is included in the second superconducting set of narrow portions in the second configuration.

4. The method of claim 1, wherein in the first configuration, the superconducting multidimensional array is configured to perform a logical operation.

5. The method of claim 4, wherein in the second configuration, the superconducting multidimensional array is configured to perform an additional logical operation that is different from the logical operation of the first configuration.

6. The method of claim 4, wherein the logical operation comprises one or more of: a logical AND operation; a logical OR operation; a majority gate operation; and an input counting operation.

7. The method of claim 1, wherein the superconducting multidimensional array is arranged in a two-dimensional array.

8. The method of claim 1, wherein the superconducting multidimensional array is patterned from a single thin film of superconducting material.

9. The method of claim 1, wherein the narrow portions of the superconducting multidimensional array have substantially a same shape.

10. The method of claim 1, wherein the current and the additional current are provided from a current source in the programmable circuit.

11. A superconducting multidimensional array comprising:
    a plurality of narrow portions of superconducting material that forms the superconducting multidimensional array; and
    a plurality of wide portions of the superconducting material that forms the superconducting multidimensional array, the plurality of narrow portions and the plurality of wide portions arranged in the superconducting multidimensional array such that the superconducting multidimensional array comprises alternating narrow portions and wide portions, one or more of the plurality of wide portions being connected to electrical terminals that are connected to a programmable circuit,
    in a first configuration, current being provided to a first superconducting set of narrow portions such that the first superconducting set of narrow portions remaining in a superconducting state while a first non-superconducting set of the narrow portions remain in a non-superconducting state, and a first electrical output is output from the one or more of the plurality of wide portions to a programmable circuit using the electrical terminals that are connected to the one or more of the plurality of wide portions, and
    in a second configuration, additional current being provided to a second superconducting set of narrow portions such that the second superconducting set of narrow portions remaining in a superconducting state while a second non-superconducting set of the narrow portions remain in a non-superconducting state, and, in the second configuration, a second electrical output is output from the one or more of the plurality of wide portions to a programmable circuit using the electrical terminals that are connected to the one or more of the plurality of wide portions.

12. The superconducting multidimensional array of claim 11, wherein a narrow portion of the superconducting multidimensional array is included in the first superconducting set of the narrow portions in the first configuration.

13. The superconducting multidimensional array of claim 12, wherein the narrow portion of the superconducting multidimensional array is included in the second superconducting set of narrow portions in the second configuration.

14. The superconducting multidimensional array of claim 12, wherein in the first configuration, the superconducting multidimensional array is configured to perform a logical operation.

15. The superconducting multidimensional array of claim 14, wherein in the second configuration, the superconducting multidimensional array is configured to perform an additional logical operation that is different from the logical operation of the first configuration.

16. The superconducting multidimensional array of claim 14, wherein the logical operation comprises one or more of: a logical AND operation; a logical OR operation; a majority gate operation; and an input counting operation.

17. The superconducting multidimensional array of claim 11, wherein the superconducting multidimensional array is arranged in a two-dimensional array.

18. The superconducting multidimensional array of claim 11, wherein the superconducting multidimensional array is patterned from a single thin film of superconducting material.

19. The superconducting multidimensional array of claim 11, wherein the narrow portions of the superconducting multidimensional array have substantially a same shape.

20. The superconducting multidimensional array of claim 11, wherein the current and the additional current are provided from a current source in the programmable circuit.

* * * * *